US010735018B2

(12) United States Patent
Hu et al.

(10) Patent No.: US 10,735,018 B2
(45) Date of Patent: Aug. 4, 2020

(54) SUCCESSIVE APPROXIMATION ALGORITHM-BASED ADC SELF-CORRECTING CIRCUIT

(71) Applicant: CHINA ELECTRONIC TECHNOLOGY CORPORATION, 24TH RESEARCH INSTITUTE, Chongqing (CN)

(72) Inventors: Rongbin Hu, Chongqing (CN); Yonglu Wang, Chongqing (CN); Zhengping Zhang, Chongqing (CN); Jian'an Wang, Chongqing (CN); Guangbing Chen, Chongqing (CN); Dongbing Fu, Chongqing (CN); Yuxin Wang, Chongqing (CN); Hequan Jiang, Chongqing (CN); Gangyi Hu, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 0 days.

(21) Appl. No.: 16/611,196

(22) PCT Filed: Jun. 21, 2017

(86) PCT No.: PCT/CN2017/089315
§ 371 (c)(1),
(2) Date: Nov. 5, 2019

(87) PCT Pub. No.: WO2018/205359
PCT Pub. Date: Nov. 15, 2018

(65) Prior Publication Data
US 2020/0195270 A1 Jun. 18, 2020

(30) Foreign Application Priority Data
May 9, 2017 (CN) .......................... 2017 1 0320936

(51) Int. Cl.
*H03M 1/46* (2006.01)
*H03M 1/36* (2006.01)

(52) U.S. Cl.
CPC ............ *H03M 1/462* (2013.01); *H03M 1/361* (2013.01); *H03M 1/362* (2013.01)

(58) Field of Classification Search
CPC ....... H03M 1/462; H03M 1/361; H03M 1/362
(Continued)

(56) References Cited

U.S. PATENT DOCUMENTS 8,462,038 B2 * 6/2013 Furuta ................. H03M 1/0697
341/110
8,587,466 B2 * 11/2013 Debnath ............... H03M 1/145
341/155
2010/0182185 A1 7/2010 Shin et al.

FOREIGN PATENT DOCUMENTS

CN 103580691 A 2/2014
CN 106130557 A 11/2016
CN 106330184 A 1/2017

* cited by examiner

*Primary Examiner* — Khai M Nguyen
(74) *Attorney, Agent, or Firm* — Cheng-Ju Chiang

(57) ABSTRACT

Disclosed is a successive approximation algorithm-based ADC self-correcting circuit, comprising: a coding circuit, a voltage dividing resistor string, a comparator array, a multi-path selection switch, a first digital-to-analog converter, a reference circuit, a control register, and a data register; an input end of the coding circuit is connected to an output end of the comparator array; a positive-phase input end of each comparator in the comparator array is connected to a mobile end of the multi-path selection switch; a negative-phase input end of each comparator in the comparator array is correspondingly connected between each two neighboring resistors in the voltage dividing resistor string; an enabling end of the comparator array is connected to the control (Continued)

register; a first immobile end of the multi-path selection switch is used for receiving an analog signal, a second immobile send is connected to an output end of the first digital-to-analog converter, and a control end is connected to the control register; the reference circuit is connected to the voltage dividing resistor string and the comparator array for use to correct an intermediate level and voltage range of the voltage dividing resistor string to be consistent with that of the output of the first digital-to-analog converter.

10 Claims, 8 Drawing Sheets

(58) Field of Classification Search
 USPC .......................................... 341/118, 159, 163
 See application file for complete search history.

SUCCESSIVE APPROXIMATION ALGORITHM-BASED ADC SELF-CORRECTING CIRCUIT

TECHNICAL FIELD

The present invention belongs to a correcting circuit, and particularly relates to a successive approximation algorithm-based ADC self-correcting circuit.

BACKGROUND

An n-bit analog-to-digital converter (ADC) divides a certain signal range into 2' quantizing intervals and encodes each of the quantizing intervals. Generally, the ADC adopts binary coding. That is, according to sizes of signals from small to large, the quantizing intervals are sequentially encoded as 000, 001, 010, . . . , and 111 (taking a 3-bit ADC as an example). FIG. 1 shows a conversion curve of a 3-bit ADC.

In a parallel conversion-type analog-to-digital converter (also called Flash ADC or flashing ADC), taking the 3-bit analog-to-digital converter as an example, as shown in FIG. 1, a signal range is divided into 8 quantizing intervals by seven signal voltages V1, V2, V3, V4, V5, V6 and V7; an input analog signal is compared with the seven signal voltages by seven comparators, and the quantizing interval in which the input analog signal is located is determined according to output of the comparators; and each of the quantizing interval is encoded, generally from small to large, as 000, 001, 010, . . . , and 111. If the comparator is an ideal comparator, the output of the flash ADC is as shown in FIG. 1. In an actual situation, due to offset of the comparators, voltages of the divided intervals deviate from V1, V2, V3, V4, V5, V6 and V7; and an actual conversion curve is as shown in FIG. 2.

An offset voltage is caused by non-uniform distribution of manufacturing process parameters of a semiconductor integrated circuit on a wafer, is distributed within a certain range, and has unpredictable magnitude and plus-minus sign. If there is the offset voltage, the flash ADC has a large INL (Integral nonlinearity) and DNL (Differential Nonlinearity) error. If the offset voltage is especially severe, it may cause a functional problem such as code missing.

At present, a larger comparator is adopted to reduce the impact of the offset voltage on the performance of the flash ADC. However, in this way, an area and cost of a chip are increased. Meanwhile, the larger comparator has a larger parasitic capacitance, which reduces a conversion speed and bandwidth of the converter.

SUMMARY

In view of technical problems in the prior art, the present disclosure provides a relatively accurate ADC self-correcting circuit. In the ADC self-correcting circuit, a successive approximation method is adopted; an output step of an analog-to-digital converter is adopted to correct quantizing intervals of a digital-to-analog converter, so that the corrected quantizing intervals of the digital-to-analog converter are distributed uniformly, thus obtaining a higher linearity and lower INL and DNL errors.

The present invention provides a successive approximation algorithm-based ADC self-correcting circuit, including: an encoding circuit, a voltage dividing resistor string, a comparator array, a multiplexer switch, a first digital-to-analog converter, a reference circuit, a control register, and a data register. The comparator array includes a plurality of comparators. The voltage dividing resistor string includes a plurality of resistors connected in series. An input end of the encoding circuit is connected to an output end of the comparator array. A non-inverting input end of each of the comparators in the comparator array is connected to a mobile end of the multiplexer switch. An inverting input end of each of the comparators in the comparator array is correspondingly connected to a point between each two neighboring resistors in the voltage dividing resistor string. An enabling end of the comparator array is connected to the control register. A first immobile end of the multiplexer switch is configured to receive an analog signal, a second immobile end of the multiplexer switch is connected to an output end of the first digital-to-analog converter, and a control end of the multiplexer switch is connected to the control register. The control register is configured to control output of the multiplexer switch. An input end of the first digital-to-analog converter is correspondingly connected to the data register. The reference circuit is connected to the voltage dividing resistor string and the comparator array, so that an intermediate level and a voltage range of the voltage dividing resistor string are corrected to be consistent with output of the first digital-to-analog converter.

The voltage dividing resistor string includes eight resistors which have equal resistance values and which are connected in series. A negative end of the first resistor is connected to a first wire net. A positive end of the first resistor is connected to a negative end of the second resistor. A positive end of the second resistor is connected to a negative end of the third resistor. A positive end of the third resistor is connected to a negative end of the fourth resistor. A positive end of the fourth resistor is connected to a second wire net. A negative end of the fifth resistor is connected to the second wire net. A positive end of the fifth resistor is connected to a negative end of the sixth resistor. A positive end of the sixth resistor is connected to a negative end of the seventh resistor. A positive end of the seventh resistor is connected to a negative end of the eighth resistor. A positive end of the eighth resistor is connected to a third wire net.

The comparator array includes seven comparators operating in parallel. Inverting input ports of the seven comparators are connected to positive ends of the first to seventh resistors, respectively. Non-inverting input ends of the seven comparators are connected together to receive a signal selected by the multiplexer switch. Each of the seven comparators further includes an enabling end and a clock end. The enabling ends of the first and fourth comparators are grounded. The enabling ends of the second and third comparators are connected to a fourth bit and a fifth bit of the control register, respectively. The enabling ends of the fifth to seventh comparators are connected to a sixth bit, a seventh bit and an eighth bit of the control register, respectively. The clock ends of the seven comparators are connected to a clock signal. Output ends of the seven comparators are connected to the encoding circuit so as to generate a binary code after encoded by the encoding circuit. An output end of the first comparator is further connected to a fourth wire net; and an output end of the fourth comparator is further connected to a fifth wire net.

The reference circuit includes a second digital-to-analog converter, a successive approximation register, a third digital-to-analog converter, another successive approximation register, a first PMOS switch transistor, a second PMOS switch transistor, a third PMOS switch transistor, a first NMOS switch transistor, a second NMOS switch transistor, a third NMOS switch transistor, a fourth NMOS switch transistor, a fifth NMOS switch transistor, a sixth NMOS switch transistor, a seventh NMOS switch transistor, and an eighth NMOS switch transistor. Sources of the first NMOS switch transistor and the second NMOS switch transistor are connected together. A gate of the first NMOS switch transistor is connected to an output end of the second digital-to-analog converter. A gate of the second NMOS switch transistor is connected to the second wire net. After being connected together, a drain and a gate of the first PMOS switch transistor are connected to a drain of the first NMOS switch transistor. After being connected together, a drain and a gate of the second PMOS switch transistors are connected to a drain of the second NMOS switch transistor. A source of the fifth NMOS switch transistor is grounded, and a drain of the fifth NMOS switch transistor is connected to a source of the sixth NMOS switch transistor. A drain of the sixth NMOS switch transistor is connected to the sources of the first and second NMOS switch transistors. A gate of the third PMOS switch transistor is connected to the drain of the first NMOS switch transistor. A drain of the third PMOS switch transistor is connected to the third wire net, and the third wire net is connected to the voltage dividing resistor string. A source of the third NMOS switch transistor is grounded, and a drain of the third NMOS switch transistor is connected to a source of the fourth NMOS switch transistor. A drain of the fourth NMOS switch transistor is connected to the first wire net, and the first wire net is connected to the voltage dividing resistor string. The second wire net is led from the middle of the voltage dividing resistor string to be fed back to the gate of the second NMOS switch transistor. A drain of the first NMOS switch transistor is connected to the gate of the third PMOS switch transistor. The second wire net is connected to the gate of the second NMOS switch transistor.

Eight digital input ends of the second digital-to-analog converter are connected to eight digital output ends of the successive approximation register, respectively. A clock input end of the successive approximation register receives the clock signal, an enabling end of the successive approximation register is connected to a second bit of the control register, and a data input end of the successive approximation register is connected to the fifth wire net. The fifth wire net is further connected to the comparator array.

A source of the seventh NMOS switch transistor is grounded; after being connected together, a gate and a drain of the seventh NMOS switch transistor are connected to gates of the fifth and third NMOS switch transistors and a source of the eighth NMOS switch transistor. After being connected together, a gate and a drain of the eighth NMOS switch transistor are connected to gates of the sixth and fourth NMOS switch transistors and an output end of the third digital-to-analog converter.

Eight digital input ends of the third digital-to-analog converter are correspondingly connected to the eight digital output ends of the successive approximation register. The clock input end of the successive approximation register receives the clock signal. The enabling end of the successive approximation register is connected to a third bit of the control register, and the data input end of the successive approximation register is connected to the fourth wire net. The fourth wire net is connected to the comparator array.

Resistance values of the plurality of resistors in the voltage dividing resistor string are equal.

An intermediate output level $V_{100}$ of the first digital-to-analog converter is configured to correct an internal reference level $V_{refl43}$ of the fourth comparator in the comparator array. A minimum output level $V_{001}$ of the first digital-to-analog converter is configured to correct an internal reference level $V_{refl40}$ of the first comparator. A second minimum output level $V_{010}$ of the first digital-to-analog converter is configured to correct an internal reference level $V_{refl41}$ of the second comparator in the comparator array. A third minimum output level $V_{011}$ of the first digital-to-analog converter is configured to correct an internal reference level $V_{refl42}$ of the third comparator in the comparator array. A fifth minimum output level $V_{101}$ of the first digital-to-analog converter is configured to correct an internal reference level $V_{refl44}$ of the fifth comparator in the comparator array. A sixth minimum output level $V_{110}$ of the first digital-to-analog converter is configured to correct an internal reference level $V_{refl45}$ of the sixth comparator in the comparator array. A seventh minimum output level $V_{111}$ of the first digital-to-analog converter is configured to correct an internal reference level $V_{refl46}$ of the seventh comparator in the comparator array, so that the internal reference levels $V_{refl40}$, $V_{refl41}$, $V_{refl42}$, $V_{refl43}$, $V_{refl44}$, $V_{refl45}$ and $V_{refl46}$ are consistent with output of the first digital-to-analog converter. Corrected internal reference voltages $V_{refl40}$, $V_{refl41}$, $V_{refl42}$, $V_{refl43}$, $V_{refl44}$, $V_{refl45}$ and $V_{refl46}$ are distributed uniformly.

The first to third digital-to-analog converters are voltage-type converters.

In the successive approximation algorithm-based ADC self-correcting circuit, a number of correction processes are performed; and an output step of the digital-to-analog converter is adopted to correct quantizing intervals of the analog-to-digital converter, so that the corrected analog-to-digital converter has higher linearity and lower INL and DNL errors. The self-correcting circuit provided by the present invention is suitable for a parallel conversion-type analog-to-digital converter, a folding and interpolating analog-to-digital converter, and other analog-to-digital converters.

DETAILED DESCRIPTION

In order to make the technical means, creative features, achieved goals and effects achieved by the present invention easy to understand, the present invention will be further described below in conjunction with specific examples.

In the description of the embodiments of the present disclosure, it should be noted that the terms "installation", "connected to" and "connecting" should be broadly understood unless explicitly defined or limited otherwise. For example, they may refer to a fixed connection, detachable connection or integrated connection, or may be a mechanical connection or electrical connection, or may refer to a direct connection or an indirect connection via an intermediary, or may be an internal communication of two elements. An ordinary person skilled in the art may understand the specific meanings of the above terms in the present invention on the basis of specific situations.

Figure 1:
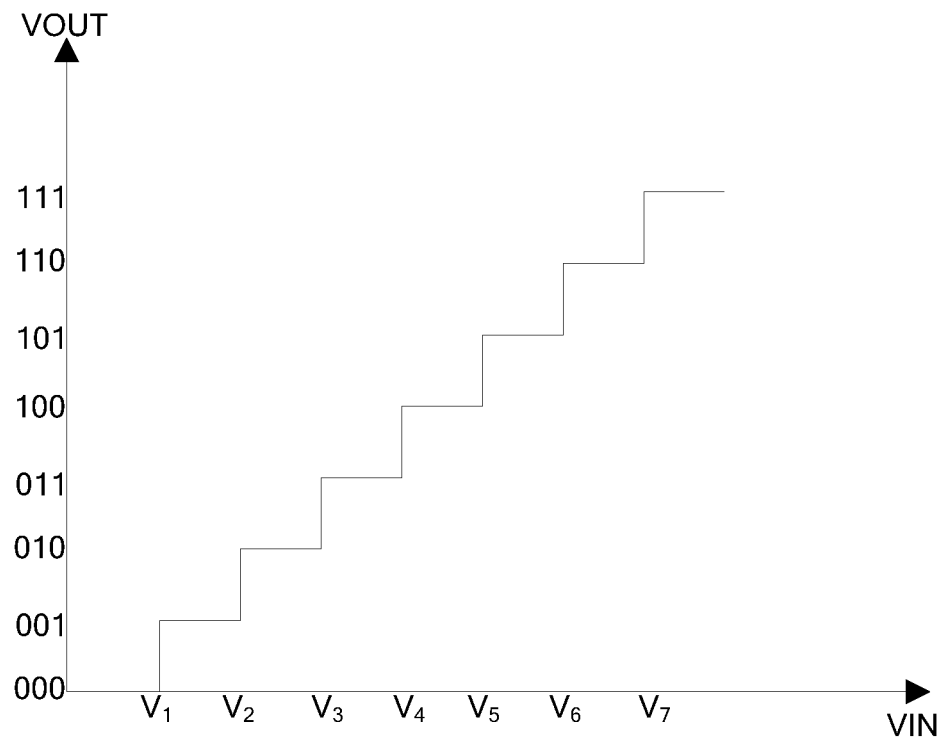
FIG. 1 is a schematic diagram of an input/output conversion curve of an ideal 3-bit flash ADC.
Figure 2:
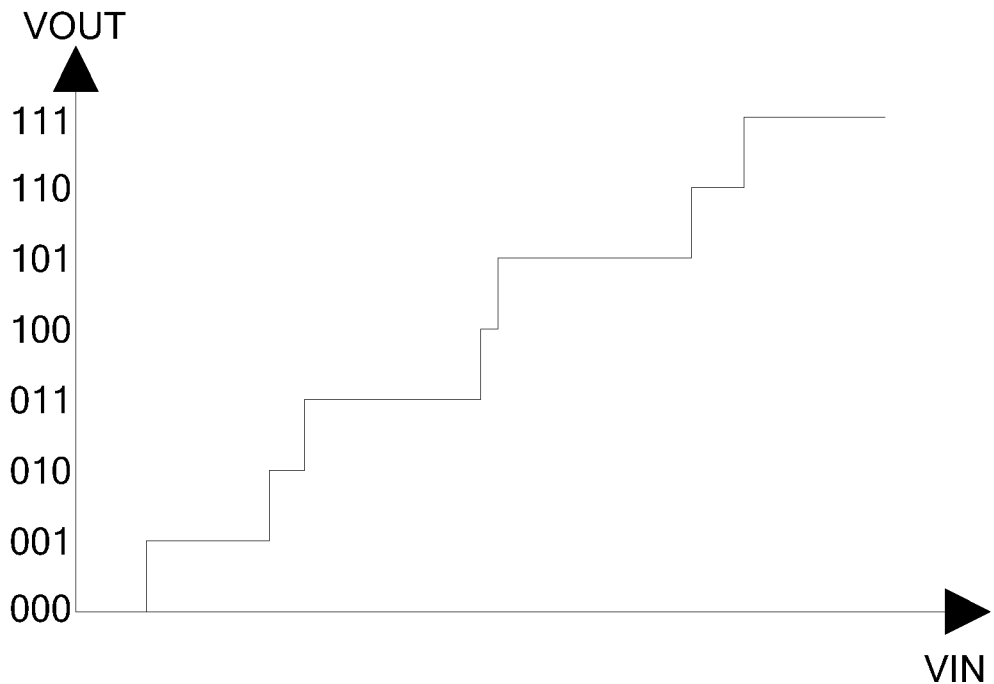
FIG. 2 is an input/output conversion curve graph of a 3-bit flash ADC in case of offset of a comparator.
Figure 3A:
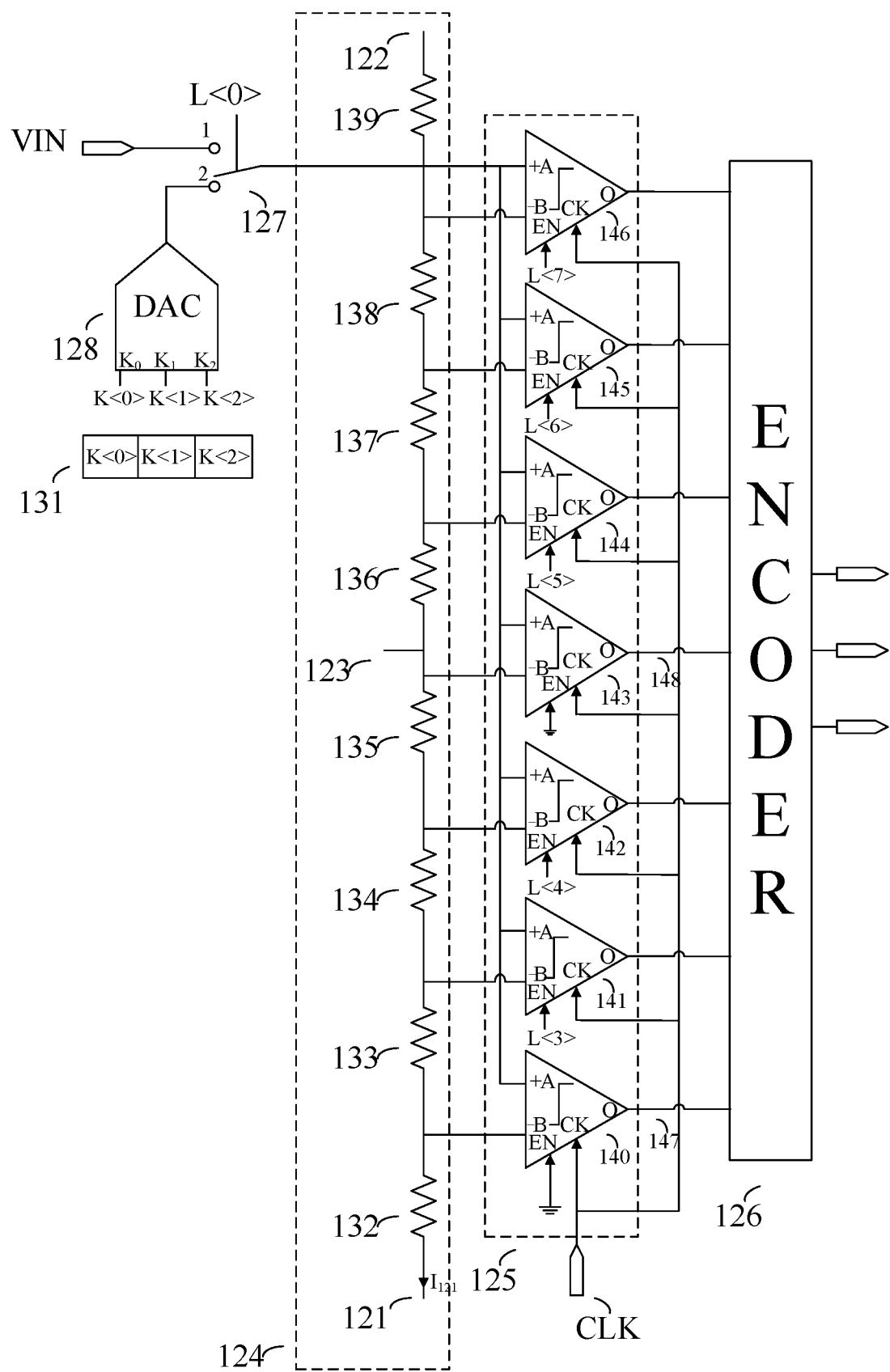
FIGS. 3A-3C are circuit diagrams of preferred embodiments of a successive approximation algorithm-based ADC self-correcting circuit in the present invention.
Figure 3B:
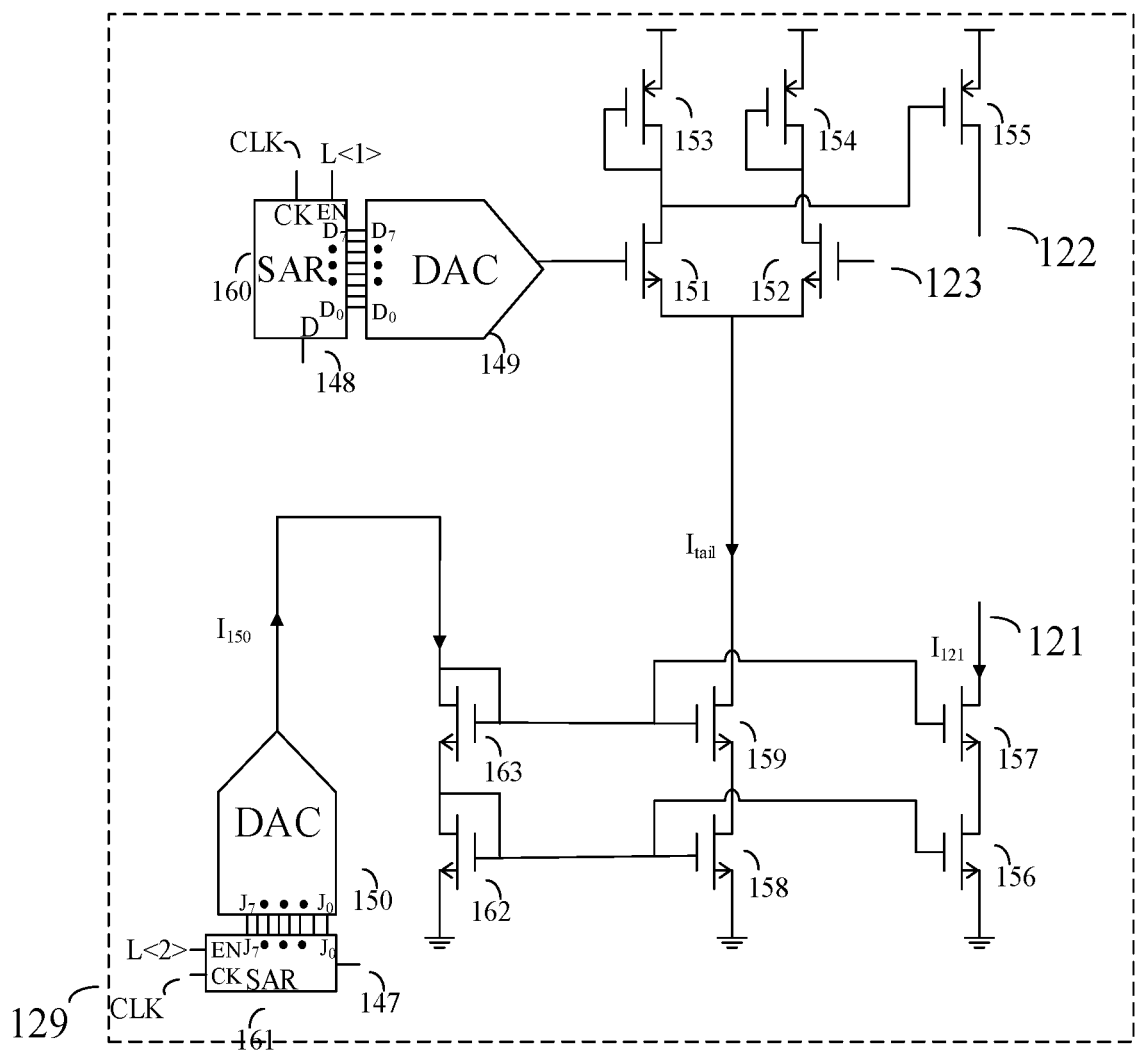
Figure 3C:
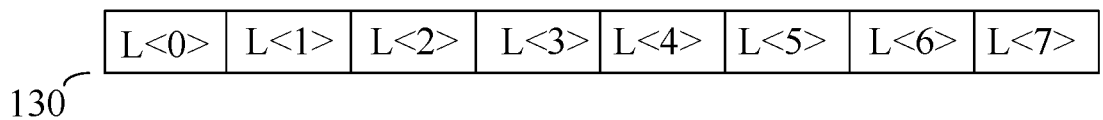

FIGS. 3A-3C are circuit diagrams of preferred embodiments of a successive approximation algorithm-based ADC self-correcting circuit in the present invention. In the preferred embodiment, the successive approximation algorithm-based ADC self-correcting circuit includes an encoding circuit 126, a voltage dividing resistor string 124, a comparator array 125, a multiplexer switch 127, a digital-to-analog converter 128, a reference circuit 129, a control register 130, and data register 131.

The control register 130 is an 8-bit register including bits L<0>, L<1>, L<2>, L<3>, L<4>, L<5>, L<6>, and L<7>. The data register 131 is a 3-bit register including bits K<2>, and K<0>.

Figure 4:
FIG. 4 is a schematic diagram of uniformly distributed electric potential generated by voltage dividing of a voltage dividing resistor string in FIGS. 3A-3C.

The voltage dividing resistor string 124 includes eight resistors. The eight resistors have the same resistance value (the resistance value named as Rseri), are connected in series, and specifically include resistors 132, 133, 134, 135, 136, 137, 138 and 139. A negative end of the resistor 132 is connected to a wire net 121, and a positive end of the resistor 132 is connected to a negative end of the resistor 133. A positive end of the resistor 133 is connected to a negative end of the resistor 134, and a positive end of the resistor 134 is connected to a negative end of the resistor 135. A positive end of the resistor 135 is connected to a wire net 123. A negative end of the resistor 136 is connected to the wire net 123. A positive end of the resistor 136 is connected to a negative end of the resistor 137. A positive end of the resistor 137 is connected to a negative end of the resistor 138. A positive end of the resistor 138 is connected to a negative end of the resistor 139. A positive end of the resistor 139 is connected to a wire net 122. By performing voltage dividing, the voltage dividing resistor string 124 generates uniformly distributed electric potentials $V_{121}$, $V_{132}$, $V_{133}$, $V_{134}$, $V_{123}$, $V_{136}$, $V_{137}$, $V_{138}$, and $V_{122}$, which are as shown in FIG. 4.

The comparator array 125 includes seven comparators operating in parallel, and specifically includes comparators 140, 141, 142, 143, 144, 145, and 146. Inverting input ports B of the seven comparators are connected to positive ends of the resistors 132, 133, 134, 135, 136, 137, and 138, respectively, so as to correspondingly receive voltages $V_{132}$, $V_{133}$, $V_{134}$, $V_{123}$, $V_{136}$, $V_{137}$, and $V_{138}$. Non-inverting input ends A of the seven comparators are connected together to receive a signal selected by the multiplexer switch 127. Each of the comparators 140, 141, 142, 143, 144, 145, and 146 further includes an enabling end EN and a clock end CK. An offset digital self-correcting structure and circuit are designed in each of the comparators 140, 141, 142, 143, 144, 145, and 146; the enabling end EN of the comparator is configured to enable an offset digital self-correcting process in the comparator; and the clock end CK is configured to receive a clock signal required by the comparator in operation and correction. The enabling ends ENs of the comparators 141, 142, 144, 145, and 146 are controlled by bits L<3>, L<4>, L<5>, L<6>, and L<7> of the control register 130, respectively. The enabling ends ENs of the comparators 140 and 143 are directly grounded, and the clock ends CKs of the comparators 140, 141, 142, 143, 144, 145 and 146 are connected to a clock signal CLK.

Output ends O of the seven comparators 140, 141, 142, 143, 144, 145, and 146 are connected to the encoding circuit 126 so as to generate a 3-bit binary code after encoding by the encoding circuit 126. An output end O of the comparator 140 is further connected to a wire net 147; and an output end O of the comparator 143 is further connected to a wire net 148.

External reference voltages of the comparators 140, 141, 142, 143, 144, 145 and 146 are $V_{132}$, $V_{133}$, $V_{134}$, $V_{123}$, $V_{136}$, $V_{137}$, and $V_{138}$ generated by voltage dividing of the voltage dividing resistor string 124, respectively. Due to offset of the comparator, an internal reference voltage of the comparator= (the corresponding voltage generated by the voltage dividing of the voltage dividing resistor string 124)+(an offset voltage of the comparator). In the present embodiment, the offset voltages of the comparators 140, 141, 142, 143, 144, 145, and 146 are represented by $V_{O140}$, $V_{O141}$, $V_{O142}$, $V_{O143}$, $V_{O144}$, $V_{O145}$, and $V_{O146}$. Therefore, the internal reference voltages of the comparators 140, 141, 142, 143, 144, 145, and 146 are $V_{132}+V_{O140}$, $V_{133}+V_{O141}$, $V_{134}+V_{O142}$, $V_{123}+V_{O143}$, $V_{136}+V_{O144}$, $V_{137}+V_{O145}$, and $V_{138}+V_{O146}$, respectively. In the following description, the internal reference voltages of the comparators 140, 141, 142, 143, 144, 145 and 146 are represented by $V_{ref140}$, $V_{ref141}$, $V_{ref142}$, $V_{ref143}$, $V_{ref144}$, $V_{ref145}$ and $V_{ref146}$, respectively.

Figure 5:
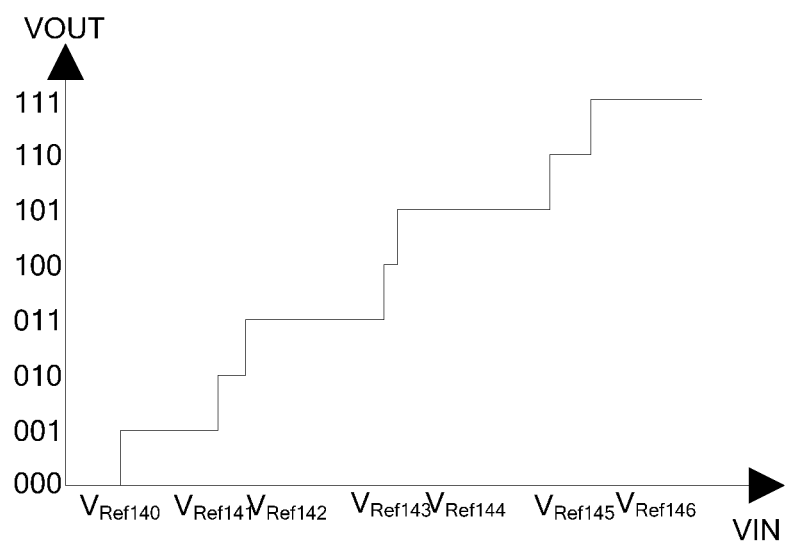
FIG. 5 is a schematic diagram of an actual conversion curve of an uncorrected 3-bit flash ADC.

An offset voltage is caused by random distribution of process parameters of a semiconductor integrated circuit on a wafer, is distributed within a certain range, and has unpredictable magnitude and plus-minus sign. If there is the offset voltage, the internal reference voltages $V_{ref140}$, $V_{ref141}$, $V_{ref142}$, $V_{ref143}$, $V_{ref144}$, $V_{ref145}$ and $V_{ref146}$ are distributed non-uniformly. FIG. 5 shows an actual conversion curve of the 3-bit flash ADC, and there are large INL and DNL errors. If the offset voltage is especially severe, it may cause a functional problem such as code missing.

A first selection input end of the multiplexer switch 127 is connected to an analog signal VIN, and a second selection input end of the multiplexer switch 127 is connected to an output end of the digital-to-analog converter 128. An output end of the multiplexer switch 127 is connected to the non-inverting input ends A of the comparators 140, 141, 142, 143, 144, 145, and 146. Specifically, the non-inverting input ends A of the comparators 140, 141, 142, 143, 144, 145, and 146 are connected to a mobile end of the multiplexer switch 127. A first immobile end of the multiplexer switch 127 is configured to receive an analog signal VIN, and a second immobile end of the multiplexer switch 127 is connected to the output end of the digital-to-analog converter 128.

The multiplexer switch 127 is controlled by an L<0> bit of the control register 130. When the L<0> bit of the control register 130 is 0, the multiplexer switch 127 selects the analog signal VIN. When an L<0> bit of the control register 130 is 1, the multiplexer switch 127 selects analog output of the digital-to-analog converter 128.

In the present embodiment, the digital-to-analog converter 128 is a 3-bit analog-to-digital converter, and the digital input ends $K_2$, $K_1$, and $K_0$ of the digital-to-analog converter 128 receive digital signals at a K<2> bit, a K<1> bit, and a K<0> bit of the data register 131, respectively. Of course, in other embodiments, the digital-to-analog converter 128 may also be selected as one having other number of bits, with a same operating principle as that in the present embodiment.

The digital-to-analog converter 128 is a voltage-type digital-to-analog converter, and a relationship between an output voltage signal and an input digital signal of the digital-to-analog converter 128 is as follows:

$$V_{128} = \frac{V_{rag128}}{8} \sum_{i=0}^{2} K_i 2^i + V_{oft128} \quad (1)$$

Figure 6:
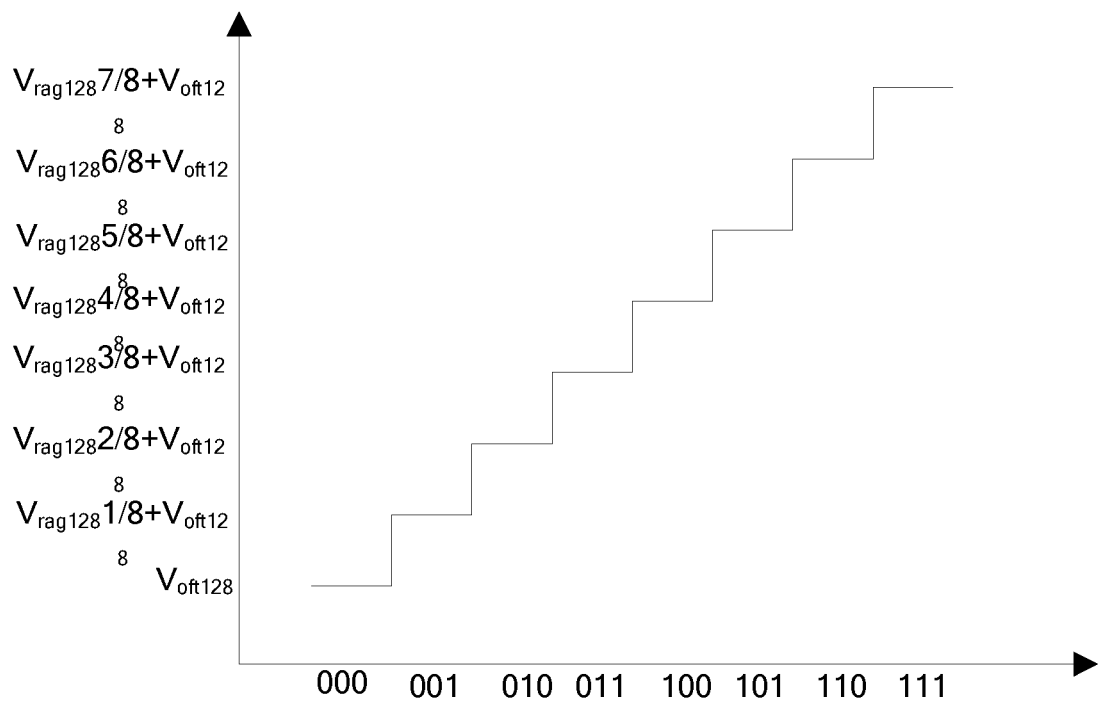
FIG. 6 is a schematic diagram of an input and output relationship of a digital-to-analog converter in FIGS. 3A-3C.

In equation (1), $V_{128}$ represents an output voltage signal of the digital-to-analog converter 128, and $V_{oft128}$ represents an output offset voltage of the digital-to-analog converter 128. That is, $V_{oft128}$ represents output of the digital-to-analog converter 128 when all of digital signals of the digital input ends $K_2$, $K_1$, and $K_0$ are 0. $V_{rag128}$ represents an output amplitude of the digital-to-analog converter 128. An input and output relationship of the digital-to-analog converter 128 is as shown in FIG. 6. Regardless of an output level $V_{oft128}$ corresponding to an input code 000, an intermediate output level of the digital-to-analog converter 128 is $V_{rag128}$ 4/8+$V_{oft128}$, and corresponds to an input digital code 100; the minimum output voltage of the digital-to-analog converter 128 is $V_{rag128}$ 1/8+$V_{oft128}$, and corresponds to a digital code 001; the second minimum output voltage of the digital-to-analog converter 128 is $V_{rag128}$ 2/8+$V_{oft128}$, and corresponds to a digital code 010; the third minimum output voltage of the digital-to-analog converter 128 is $V_{rag128}$ 3/8+$V_{oft128}$, and corresponds to a digital code 011; the fourth minimum output voltage of the digital-to-analog converter 128 is the intermediate output level; the fifth minimum output voltage of the digital-to-analog converter 128 is $V_{rag128}$ 5/8+$V_{oft128}$, and corresponds to a digital code 101; the sixth minimum output voltage of the digital-to-analog converter 128 is $V_{rag128}$ 6/8+$V_{oft128}$, and corresponds to a digital code 110; and the seventh minimum output voltage of the digital-to-analog converter 128 is $V_{rag128}$ 7/8+$V_{oft128}$, and corresponds to a digital code 111. In the present embodiment, the output voltage signals of the digital-to-analog converter 128 are represented by $V_{001}$, $V_{010}$, $V_{011}$, $V_{100}$, $V_{101}$, $V_{110}$, and $V_{111}$ respectively when the input codes are 001, 010, 011, 100, 101, 110, and 111. Under an existing integrated circuit design and process condition, the digital-to-analog converter is very accurate, so that the voltages $V_{001}$, $V_{010}$, $V_{011}$, $V_{100}$, $V_{101}$, $V_{110}$, and $V_{111}$ are substantially uniformly distributed. FIG. 6 shows uniformly distributed stairs.

Figure 7:
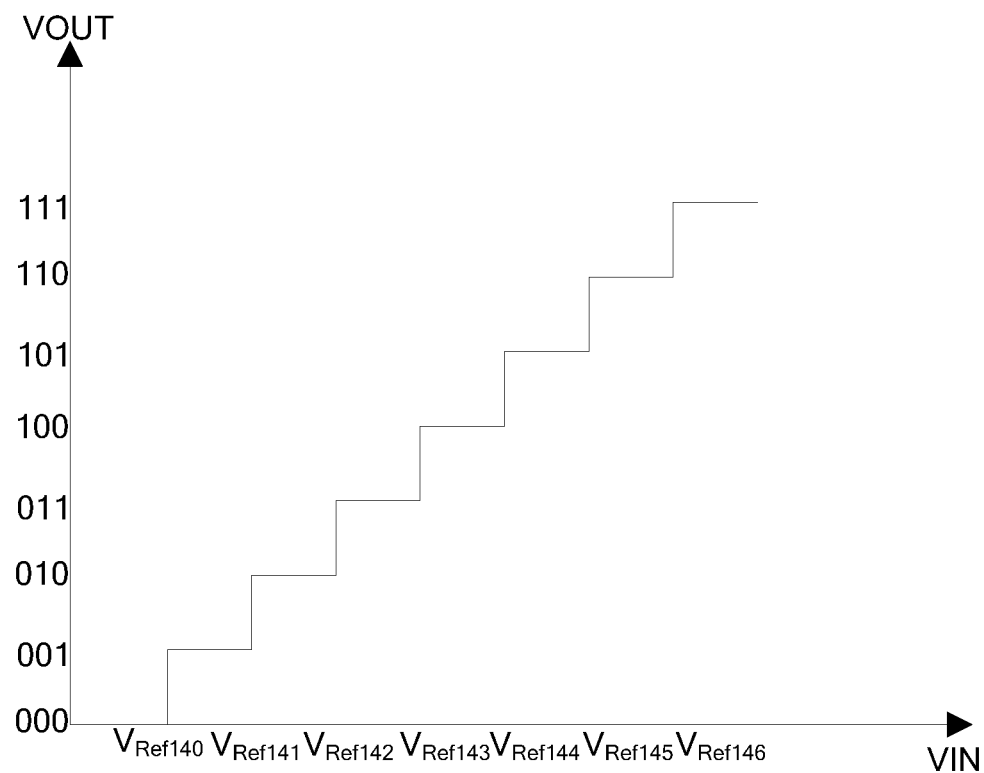
FIG. 7 is a schematic diagram of an actual conversion curve of a corrected 3-bit flash ADC.

In the present invention, the intermediate output level $V_{100}$ of the digital-to-analog converter 128 is utilized to correct an internal reference level $V_{ref143}$ of the comparator 143 in the comparator array 125. The minimum output level $V_{001}$ of the digital-to-analog converter 128 is utilized to correct an internal reference level $V_{ref140}$ of the comparator 140. The second minimum output level $V_{010}$ of the digital-to-analog converter 128 is utilized to correct an internal reference level $V_{ref141}$ of the comparator 141 in the comparator array 125. The third minimum output level $V_{011}$ of the digital-to-analog converter 128 is utilized to correct an internal reference level $V_{ref142}$ of the comparator 142 in the comparator array 125. The fifth minimum output level $V_{101}$ of the digital-to-analog converter 128 is utilized to correct an internal reference level $V_{ref144}$ of the comparator 144 in the comparator array 125. The sixth minimum output level $V_{110}$ of the digital-to-analog converter 128 is utilized to correct an internal reference level $V_{ref145}$ of the comparator 145 in the comparator array 125. The seventh minimum output level $V_{111}$ of the digital-to-analog converter 128 is utilized to correct an internal reference level $V_{ref146}$ of the comparator 146 in the comparator array 125, so that the internal reference levels $V_{ref140}$, $V_{ref141}$, $V_{ref142}$, $V_{ref143}$, $V_{ref144}$, $V_{ref145}$ and $V_{ref146}$ are consistent with the output of the digital-to-analog converter 128. The corrected internal reference voltages $V_{ref140}$, $V_{ref141}$, $V_{ref142}$, $V_{ref143}$, $V_{ref144}$, $V_{ref145}$ and $V_{ref146}$ are distributed uniformly, and a finally obtained ADC conversion curve is as shown in FIG. 7.

The reference circuit 129 includes a digital-to-analog converter 149, a successive approximation register 160, a digital-to-analog converter 150, a successive approximation register 161, a PMOS switch transistor 153, a PMOS switch transistor 154, a PMOS switch transistor 155, an NMOS switch transistor 151, an NMOS switch transistor 152, an NMOS switch transistor 156, an NMOS switch transistor 157, an NMOS switch transistor 158, an NMOS switch transistor 159, an NMOS switch transistor 162, and an NMOS switch transistor 163.

In this embodiment, the PMOS switch transistor 153, the PMOS switch transistor 154, the NMOS switch transistor 151, the NMOS switch transistor 152, the NMOS switch transistor 158, and the NMOS switch transistor 159 constitute a first stage of an amplifier (named as AMP1).

The NMOS switch transistor 151 and the NMOS switch transistor 152 constitute a differential input pair of the amplifier AMP1, and a source of the NMOS switch transistor 151 is connected to a source of the NMOS switch transistor 152. A gate of the NMOS switch transistor 151 serves as a non-inverting input end of the amplifier AMP1 and is connected to an output end of the digital-to-analog converter 149. A gate of the NMOS switch transistor 152 serves as an inverting input end of the amplifier AMP1 and is connected to a wire net 123 (a voltage signal is fed back to the wire net 123 by the voltage dividing resistor string 124).

The PMOS switch transistor 153 and the PMOS switch transistor 154 are connected in a diode manner to be used as an active load. After being connected together, a drain and a gate of the PMOS switch transistors 153 are connected to a drain of the NMOS switch transistor 151.

After being connected together, a drain and a gate of the PMOS switch transistors 154 are connected to a drain of the NMOS switch transistor 152. Meanwhile, the drain of the NMOS switch transistor 151 serves as an output end of the first stage of the amplifier AMP1.

A source of the NMOS switch transistor 158 is grounded. A drain of the NMOS switch transistor 158 is connected to a source of the NMOS switch transistor 159. A drain of the NMOS switch transistor 159 is connected to sources of the NMOS switch transistors 151 and 152.

The PMOS switch transistor 155, the NMOS switch transistor 157, the NMOS switch transistor 156 and the voltage dividing resistor string 124 constitute a second stage of the amplifier AMP1. A gate of the PMOS switch transistor 155 is connected to output (i.e., the drain of the NMOS switch transistor 151) of the first stage of the amplifier AMP1. A drain of the PMOS switch transistor 155 is connected to the wire net 122, and the wire net 122 is connected to a positive end 139 of the voltage dividing resistor string 124. A source of the NMOS switch transistor 156 is grounded. A drain of the NMOS switch transistor 156 is connected to a source of the NMOS switch transistor 157. A drain of the NMOS switch transistor 157 is connected to the wire net 121, and the wire net 121 is connected to a negative end of the resistor 132 in the voltage dividing resistor string 124. The wire net 123 is led from the middle of the voltage dividing resistor string 124 to be fed back to the gate (i.e., an inverting input end of the amplifier AMP1) of the NMOS switch transistor 152.

After output from the drain of the NMOS switch transistor 151, the first stage of the amplifier AMP1 is connected to a gate (input of the second stage) of the PMOS switch transistor 155; and the output (the wire line 123) of the second stage is fed back to the inverting input end (i.e., the gate of the NMOS switch transistor 152) of the amplifier AMP1. It can be seen that the amplifier AMP1 constitutes a negative feedback. By virtue of the negative feedback, the voltage $V_{123}$ of the wire net 123 is equal to the output voltage $V_{149}$ of the digital-to-analog converter 149:

$$V_{123} = V_{149} \quad (2).$$

Digital input ends $D_7, D_6, D_5, D_4, D_3, D_2, D_1$, and $D_0$ of the digital-to-analog converter 149 are connected to digital output ends $D_7, D_6, D_5, D_4, D_3, D_2, D_1$, and $D_0$ of the successive approximation register 160, respectively. A clock input end CK of the successive approximation register 160 receives a clock signal CLK; an enabling end EN of the successive approximation register 160 is connected to a bit L<1> of the control register 130; and a data input end D of the successive approximation register 160 is connected to a wire net 148. The wire net 148 is further connected to the output end of the comparator 143.

The digital-to-analog converter 149 is a voltage-type analog-to-digital converter, and a relationship between output voltages and input digital signals $D_7, D_6, D_5, D_4, D_3, D_2,$ and $D_1$ of the digital-to-analog converter 149 is as follows:

$$V_{149} = \frac{V_{rag149}}{2^8} \sum_{i=0}^{7} D_i 2^i + V_{off149}. \quad (3)$$

In equation (3), $V_{149}$ represents the output voltage of the digital-to-analog converter 149, $V_{off149}$ represents an output offset voltage of the digital-to-analog converter 149, and $V_{rag149}$ represents an output amplitude of the digital-to-analog converter 149.

Substituting equation (2) into equation (3), the following equation is obtained:

$$V_{123} = \frac{V_{rag149}}{2^8} \sum_{i=0}^{7} D_i 2^i + V_{off149}. \quad (4)$$

Further, an actual reference voltage of the comparator 143 is as follows:

$$V_{ref143} = V_{123} + V_{O143} = \frac{V_{rag149}}{2^8} \sum_{i=0}^{7} D_i 2^i + V_{off149} + V_{O143}. \quad (5)$$

As described above, $V_{o143}$ represents an offset voltage of the comparator 143.

The NMOS switch transistors 156, 157, 158, 159, 162, and 163 constitute a cascode current mirror structure (named as an MIR). A source of the NMOS switch transistor 162 is grounded. After connected together, a gate and a drain of the NMOS switch transistor 162 are connected to gates of the NMOS switch transistors 158 and 156 and a source of the NMOS switch transistor 163. After connected together, a gate and a drain of the NMOS switch transistor 163 are connected to gates of the NMOS switch transistors 159 and 157 and output of the analog-to-digital converter 150.

After proportionally mirrored by the cascode current mirror (MIR), the output current of the analog-to-digital converter 150 is supplied to the first stage of the amplifier AMP1 as a current $I_{tail}$, and is supplied to a second stage of the amplifier AMP2 to provide current $I_{124}$ to the resistor string 124.

Digital input ends $J_7, J_6, J_5, J_4, J_3, J_2, J_1$ and $J_0$ of the analog-to-digital converter 150 are connected to digital output ends $J_7, J_6, J_5, J_4, J_3, J_2, J_1$ and $J_0$ of the successive approximation register 161. A clock input end CK of the successive approximation register 161 receives a clock signal CLK; an enabling end EN of the successive approximation register 161 is connected to the L<2> bit of the control register 130; and a data input end D of the successive approximation register 161 is connected to the wire net 147. The wire net 147 is connected to the output end O of the comparator 140.

The analog-to-digital converter 150 is a current-type analog-to-digital converter, and a relationship between an output current signal and an input digital signal of the analog-to-digital converter 150 is as follows:

$$I_{150} = \frac{I_{rag150}}{2^8} \sum_{i=0}^{7} J_i 2^i + I_{off150}. \quad (6)$$

In equation (6), $I_{150}$ represents the output current of the analog-to-digital converter 150, $I_{off150}$ represents an output offset current of the analog-to-digital converter 150, and $I_{rag150}$ represents an output amplitude of the analog-to-digital converter 150.

By virtue of the effect of the cascode current mirror (MIR), current flowing through the resistor string 124 is:

$$I_{124} = aI_{150} = \frac{aI_{rag150}}{2^8} \sum_{i=0}^{7} J_i 2^i + aI_{off150}. \quad (7)$$

In equation (7), $I_{124}$ represents the current flowing through the resistor string 124, and a represents a comparison coefficient of a proportional current mirror. A divided voltage generated by the resistor string 124 is:

$$V_{132} = V_{123} - 3R_{seri} I_{124} \quad (8).$$

An internal reference voltage $V_{ref140}$ of the comparator 140 is:

$$V_{ref140} = V_{132} + V_{O140} \quad (9).$$

As described above, $V_{O140}$ represents an offset voltage of the comparator 140.

Combining the above equations (7), (8) and (9), the following equation can be obtained:

$$V_{ref140} = V_{123} - \frac{3R_{seri} aI_{rag150}}{2^8} \sum_{i=0}^{7} J_i 2^i + 3R_{seri} aI_{off150} + V_{O140}. \quad (10)$$

An operating principle of the above self-correcting circuit will be described briefly. In the 3-bit flash ADC shown in FIG. 3, when the circuit is powered on, the control register 130 is reset, and all of the bits of the control register 130 are initially reset to 0, so that the offset digital self-correcting structures and circuits in the comparators 141, 142, 144, 145, and 146 are reset, and meanwhile, the successive approximation registers 160 and 161 are reset. Meanwhile, the multiplexer switch 127 selects the analog signal VIN; and the 3-bit flash ADC is in an uncorrected operating state.

After the analog signal VIN is compared with the internal reference voltages of the comparators 140, 141, 142, 143, 144, 145, and 146, comparison results are output. The output of the comparators 140, 141, 142, 143, 144, 145, and 146 forms encoding for the analog signal VIN, while the encoding efficiency is too low. After encoded by the encoding circuit 126, the output of the comparators 140, 141, 142, 143, 144, 145, and 146 are converted to binary codes.

By virtue of the offset voltages of the comparators, the internal reference voltages of the comparators are distributed non-uniformly, resulting in large DNL and INL errors of the flash ADC, as shown in FIG. 5. If the offset voltage is especially severe, it may cause a functional problem such as code missing. Therefore, the flash ADC must be corrected.

If there is a large difference between the output voltage of the analog-to-digital converter 128 and the divided voltage generated by the voltage dividing resistor string 124, a comparator offset digital self-correcting range may be exceeded. Thus, in the present invention, first, the reference circuit 129 is corrected, so that the intermediate level and the voltage range of the voltage dividing resistor string 124 are corrected to be substantially coincided with the output of the analog-to-digital converter 128. Finally, an offset digital self-correcting process of the comparator is started. In this way, a requirement on the comparator offset correction range is reduced, and the correction accuracy is improved.

The correction process in the present invention is divided into seven stages which correspondingly correct the internal reference voltages $V_{ref143}$, $V_{ref140}$, $V_{ref141}$, $V_{ref142}$, $V_{ref144}$, $V_{ref145}$ and $V_{ref146}$ of the comparators 143, 140, 141, 142, 144, 145, and 146, respectively. The correction of the internal reference voltages $V_{ref143}$ and $V_{ref140}$ of the comparators 143 and 140 is achieved by correcting the reference circuit 129. The correction of the internal reference voltages $V_{ref141}$, $V_{ref142}$, $V_{ref144}$, $V_{ref145}$ and $V_{ref146}$ of the comparators 141, 142, 144, 145 and 146 is achieved by the offset digital self-correcting structures and circuits in these comparators.

At the start of the correction, first, the L<0> bit of the control register 130 is set to 1; and the multiplexer switch 127 selects the output of the analog-to-digital converter 128.

When the first stage of the correction is started, first, data 100 is written to the data register 131; and the analog-to-digital converter 128 outputs voltage $V_{100}$. According to equation (1), $V_{100}=V_{rag128}/2+V_{oft128}$.

Figure 8:
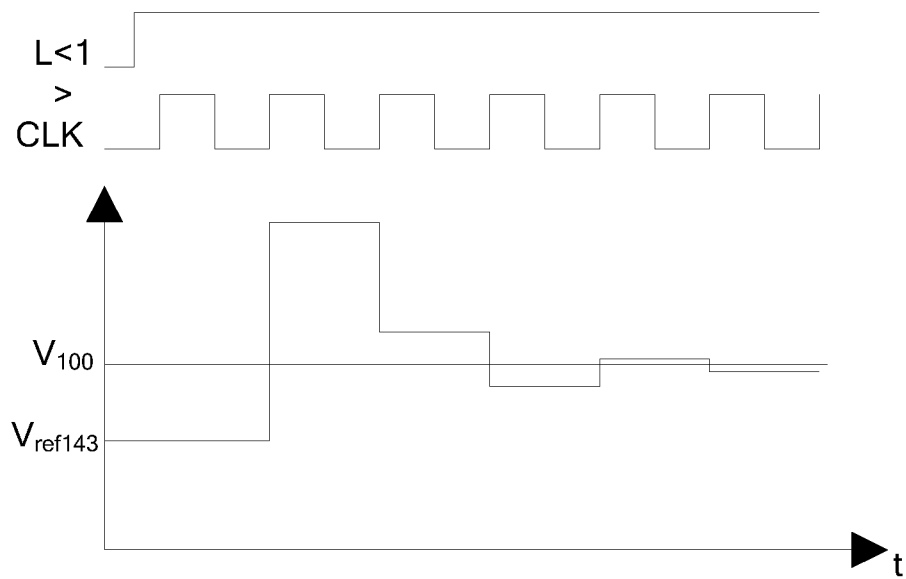
FIG. 8 is a correction timing diagram of internal reference voltages of a fourth comparator in FIGS. 3A-3C.

As shown in FIG. 8, then, the L<1> bit of the control register 130 is set to 1, and the successive approximation register 160 starts to operate.

As shown in FIG. 8, in the initial state, the D7 bit of the successive approximation register 160 is set to 1, and the remaining bits of the successive approximation register 160 are set to 0. According to equation (5), the internal reference voltage of the comparator 143 is:

$$V_{ref143} = \frac{V_{rag149}}{2} + V_{oft149} + V_{O143}.$$

As shown in FIG. 8, after the L<1> bit of the control register 130 is set to 1, when a first clock rising edge arrives, the successive approximation register 160 keeps its D7 bit at 1, and the remaining bits of the successive approximation register 160 are set to 0. The internal reference voltage $V_{ref143}$ of the comparator 143 keeps unchanged. Thereafter, the comparator 143 compares its internal reference voltage $V_{ref143}$ with the output $V_{100}$ of the analog-to-digital converter 128. When $V_{100}$ is greater than $V_{ref143}$, 1 is output; when $V_{100}$ is less than $V_{ref143}$, 0 is output.

As shown in FIG. 8, after the L<1> bit of the control register 130 is set to 1, when a second clock rising edge arrives, if the comparator outputs 1, the successive approximation register 160 keeps its D7 bit at 1, and sets the D6 bit to 1; and $V_{ref143}$ jumps up by $V_{rag149}/4$. If the comparator outputs 0, the successive approximation register 160 sets its D7 bit to 0, and sets the D6 bit to 1; and $V_{ref143}$ jumps down by $V_{rag149}/4$. Thereafter, the comparator 143 compares its internal reference voltage $V_{ref143}$ with the output $V_{100}$ of the analog-to-digital converter 128. When $V_{100}$ is greater than $V_{ref143}$, 1 is output; when $V_{100}$ is less than $V_{ref143}$, 0 is output.

As shown in FIG. 8, after the L<1> bit of the control register 130 is set to 1, when a third clock rising edge arrives, if the comparator outputs 1, the successive approximation register 160 keeps its D6 bit at 1, and sets the D5 bit to 1; and $V_{ref143}$ jumps up by $V_{rag149}/8$. If the comparator outputs 0, the successive approximation register 160 sets its D6 bit at 0, and sets the D5 bit to 1; and $V_{ref143}$ jumps down by $V_{rag149}/8$. Thereafter, the comparator 143 compares its internal reference voltage $V_{ref143}$ with the output $V_{100}$ of the analog-to-digital converter 128. When $V_{100}$ is greater than $V_{ref143}$, 1 is output; when $V_{100}$ is less than $V_{ref143}$, 0 is output.

In a process the same as the above process, the successive approximation register 160 determines the D5 bit on a fourth clock rising edge, the D4 bit on a fifth clock rising edge, and the D3 bit on a sixth clock rising edge, the D2 bit on a seventh clock rising edge, the D1 bit on the eighth clock rising edge, and finally, the D0 bit on a ninth clock rising edge. After that, the first stage of the correction ends.

As shown in FIG. 8, during the entire first stage of the correction, $V_{ref143}$ sequentially jumps up or down by $V_{rag149}/2^2$, $V_{rag149}/2^3$, $V_{rag149}/2^4$, $V_{rag149}/2^5$, ... around the output $V_{100}$ of the analog-to-digital converter under the driving of the clock signal according to the output results of the comparator till it gradually converges to $V_{100}$; and finally, $V_{ref143}$ differs from $V_{100}$ by only $V_{rag149}/2^8$. In addition, as the number of bits of the adopted analog-to-digital converter increases, this difference will decrease further. In the case of meeting a certain accuracy requirement, it is considered that $V_{ref143}$ is equal to $V_{100}$. However, as the output of the analog-to-digital converter, $V_{100}$ can be accurately designed and is independent of the comparator offset.

When the second stage of the correction is started, first, data 001 is written to the data register 131; and the analog-to-digital converter 128 outputs voltage $V_{001}$. According to equation (1), $V_{001}=V_{rag128}/2+V_{oft128}$.

Then, the L<2> bit of the control register 130 is set to 1, and the successive approximation register 161 starts to operate.

In the initial state, the J7 bit of the successive approximation register 161 is set to 1, and the remaining bits of the successive approximation register 161 are set to 0. According to equation (10), the internal reference voltage $V_{ref140}$ of the comparator 140 is:

$$V_{ref140} = V_{123} - \frac{3R_{seri}aI_{rag150}}{2} - 3R_{seri}aI_{oft150} + V_{o140}.$$

After the L<2> bit of the control register 130 is set to 1, when a first clock rising edge arrives, the successive approximation register 161 keeps its J7 bit at 1, and the remaining bits of the successive approximation register 161 are set to 0. The actual reference voltage $V_{ref140}$ of the comparator 140 keeps unchanged. Thereafter, the comparator 140 compares its internal reference voltage $V_{ref140}$ with the output $V_{001}$ of the analog-to-digital converter 128. When $V_{001}$ is greater than $V_{ref140}$, 1 is output; when $V_{001}$ is less than $V_{ref140}$, 0 is output.

After the L<2> bit of the control register 130 is set to 1, when a second clock rising edge arrives, if the comparator outputs 1, the successive approximation register 161 sets the J7 bit to 0, and the J6 bit to 1; and $V_{ref140}$ jumps up by $V_{rag149}/4$. If the comparator outputs 0, the successive approximation register 161 keeps the J7 bit at 1, and sets the J6 bit to 1; and $V_{ref140}$ jumps down by $V_{rag149}/4$. Thereafter, the comparator 140 compares its internal reference voltage $V_{ref140}$ with the output $V_{001}$ of the analog-to-digital converter 128. When $V_{001}$ is greater than $V_{ref140}$, 1 is output; when $V_{001}$ is less than $V_{ref140}$, 0 is output.

After the L<2> bit of the control register 130 is set to 1, when a third clock rising edge arrives, if the comparator outputs 1, the successive approximation register 161 sets the J6 bit to 1, and the J5 bit to 1; and $V_{ref140}$ jumps up by $V_{rag149}/8$. If the comparator outputs 0, the successive approximation register 161 keeps the J6 bit at 1, and sets the J5 bit to 1; and $V_{ref140}$ jumps down by $V_{rag149}/8$. Thereafter, the comparator 140 compares its internal reference voltage $V_{ref140}$ with the output $V_{001}$ of the analog-to-digital converter 128. When $V_{001}$ is greater than $V_{ref140}$, 1 is output; when $V_{001}$ is less than $V_{ref140}$, 0 is output.

In a process the same as the above process, the successive approximation register 161 determines the J5 bit on a fourth clock rising edge, the J4 bit on a fifth clock rising edge, and the J3 bit on a sixth clock rising edge, the J2 bit on a seventh clock rising edge, the J1 bit on the eighth clock rising edge, and finally, the J0 bit on a ninth clock rising edge. After that, the second stage of the correction ends.

During the entire second stage of the correction, $V_{ref140}$ sequentially jumps up or down by $V_{rag149}/2^2$, $V_{rag149}/2^3$, $V_{rag149}/2^4$, $V_{rag149}/2^5$, ... around the output $V_{100}$ of the analog-to-digital converter under the driving of the clock signal according to the output results of the comparator 140 till it gradually converges to $V_{001}$; and finally, $V_{ref140}$ differs from $V_{100}$ by only $V_{rag149}/2^8$. In addition, as the number of bits of the adopted analog-to-digital converter increases, this difference will decrease further. In the case of meeting a certain accuracy requirement, it is considered that $V_{ref140}$ is equal to $V_{001}$. However, as the output of the analog-to-digital converter, $V_{001}$ can be accurately designed and is independent of the comparator offset.

When the third stage of the correction is started, first, data 010 is written to the data register 131; and the analog-to-digital converter 128 outputs voltage $V_{010}$. According to equation (1), $V_{010}=2V_{rag128}/8+V_{oft128}$.

Then, the L<3> bit of the control register 130 is set to 1, and the offset correction structure and circuit inside the comparator 141 start to operate. After a number of correction clock cycles, the internal reference voltage $V_{ref141}$ of the comparator 141 is corrected to $V_{010}$ within a certain accuracy range.

When the fourth stage of the correction is started, first, data 011 is written to the data register 131; and the analog-to-digital converter 128 outputs voltage $V_{011}$. According to equation (1), $V_{011}=3V_{rag128}/8+V_{oft128}$.

Then, the L<4> bit of the control register 130 is set to 1, and the offset correction structure and circuit inside the comparator 142 start to operate. After a number of correction clock cycles, the internal reference voltage $V_{ref142}$ of the comparator 142 is corrected to $V_{011}$ within a certain accuracy range.

When the fifth stage of the correction is started, first, data 101 is written to the data register 131; and the analog-to-digital converter 128 outputs voltage $V_{101}$. According to equation (1), $V_{101}=5V_{rag128}/8+V_{oft128}$.

Then, the L<5> bit of the control register 130 is set to 1, and the offset correction structure and circuit inside the comparator 144 start to operate. After a number of correction clock cycles, the internal reference voltage $V_{ref144}$ of the comparator 144 is corrected to $V_{101}$ within a certain accuracy range.

When the sixth stage of the correction is started, first, data 110 is written to the data register 131; and the analog-to-digital converter 128 outputs voltage $V_{110}$. According to equation (1), $V_{110}=6V_{rag128}/8+V_{oft128}$.

Then, the L<6> bit of the control register 130 is set to 1, and the offset correction structure and circuit inside the comparator 145 start to operate. After a number of correction clock cycles, the internal reference voltage $V_{ref145}$ of the comparator 145 is corrected to $V_{110}$ within a certain accuracy range.

When the seventh stage of the correction is started, first, data 111 is written to the data register 131; and the analog-to-digital converter 128 outputs voltage $V_{111}$. According to equation (1), $V_{111}=7V_{rag128}/8+V_{oft128}$.

Then, the L<7> bit of the control register 130 is set to 1, and the offset correction structure and circuit inside the comparator 146 start to operate. After a number of correction clock cycles, the internal reference voltage $V_{ref146}$ of the comparator 146 is corrected to $V_{111}$ within a certain accuracy range. So far, the entire correction process is completed.

After the first to seventh stages of the correction, the internal reference voltages $V_{ref140}$, $V_{ref141}$, $V_{ref142}$, $V_{ref143}$, $V_{ref144}$, $V_{ref145}$ and $V_{ref146}$ of the comparators 140, 141, 142, 143, 144, 145, and 146 are corrected to $V_{001}$, $V_{010}$, Von, $V_{100}$, Viol, $V_{110}$ and $V_{111}$, respectively. $V_{001}$, $V_{010}$, Von, $V_{100}$, Viol, Vim and $V_{111}$ are the outputs of the analog-to-digital converter 128, are unaffected by the comparator offsets, and are designable, predictable, and distributed uniformly. The corrected internal reference voltages sequentially increase from $V_{rag128}/8+V_{oft128}$ to $V_{rag128}7/8+V_{oft128}$. After correction, a transmission curve of the 3-bit flash ADC is as shown in FIG. 7. After correction, the flash ADC has excellent linearity compared with that before correction (shown in FIG. 5).

In FIG. 3, control ends EN of the comparators 140 and 143 are grounded as the correction of the comparators 140 and 143 is achieved by the correction of the reference circuit 129. Comparator self-correcting method and principle will be briefly introduced below.

Figure 9:
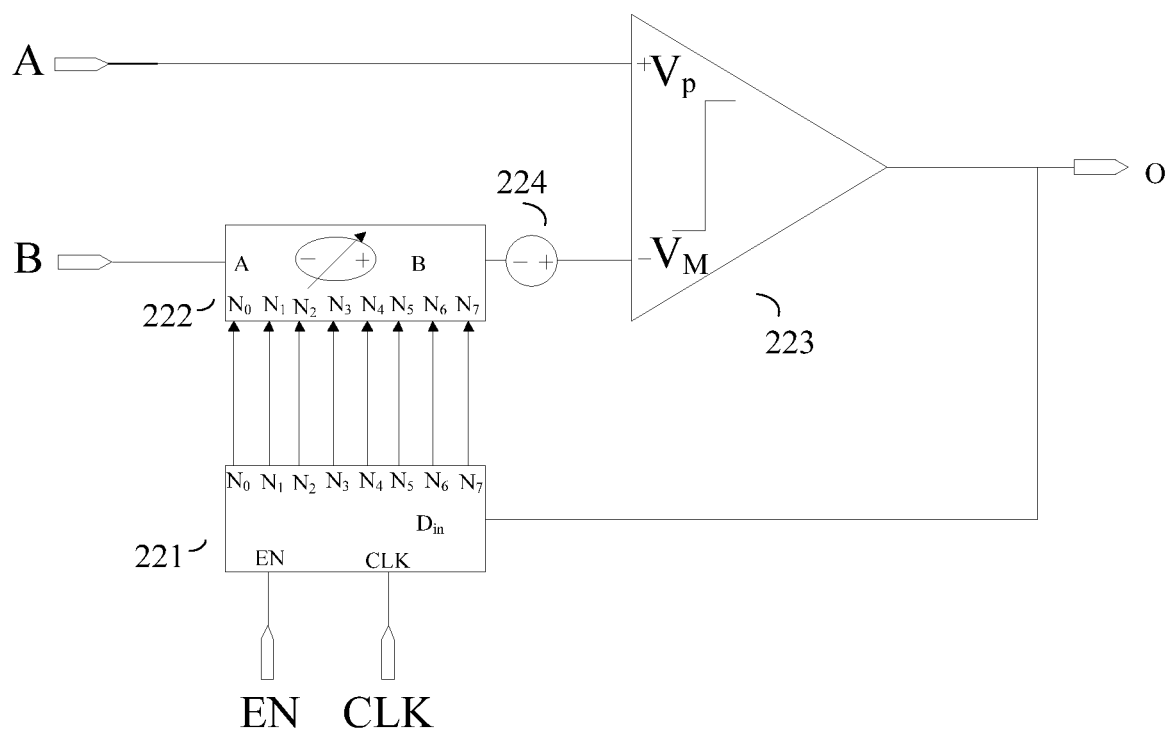
FIG. 9 is a schematic diagram of a self-correcting circuit of a comparator.

In the present embodiment, the comparator self-correcting method and principle are illustrated by using a circuit shown in FIG. 9. The circuit shown in FIG. 9 includes an ideal comparator 223, a voltage source 224, an offset digital adjustment circuit 222, a successive approximation register 221, an enabling port EN, a clock port CLK, a port B, a port A, and an output port O.

The voltage source 224 and the ideal comparator 223 are configured to simulate an actual comparator. The voltage source 224 is configured to simulate an offset voltage of the actual comparator. The port B receives a reference voltage generated by the voltage dividing resistor string 124 in FIG. 3; the port A receives a voltage signal from the analog-to-digital converter 128 in FIG. 3 in the correction phase; and the output port O is configured to output a comparison result.

The port B is connected to the port A of the offset digital adjustment circuit 222; the port B of the offset digital adjustment circuit 222 is connected to a negative end of the voltage source 224; a positive end of the voltage source 224 is connected to an inverting input end $V_M$ of the comparator 223; and a non-inverting input end $V_P$ of the 223 is connected to the port A. The output end of the comparator 223 is connected to the data input end $D_{in}$ of the successive approximation register 221; the enabling end EN of the successive approximation register 221 is connected to the enabling port EN; and the clock end CLK of the successive approximation register 221 is connected to the clock port CLK. Data output ports $N_0$, $N_1$, $N_2$, $N_3$, $N_4$, $N_5$, $N_6$, and $N_7$ are connected to data input ports $N_0$, $N_1$, $N_2$, $N_3$, $N_4$, $N_5$, $N_6$, and $N_7$ of the offset digital adjustment circuit 222.

A relationship between a voltage $V_{AB}$ between the port B and the port A of the offset digital adjustment circuit 222 and digital port signals $N_0$, $N_1$, $N_2$, $N_3$, $N_4$, $N_5$, $N_6$, and $N_7$ is as follows:

$$V_{AB} = V_s \sum_{i=0}^{7} \frac{N_i}{2^{7-i}} - \frac{V_s}{2}. \quad (11)$$

It can be seen from equation (11) that the relationship between the voltage $V_{AB}$ between the ports of the offset digital adjustment circuit 222 and the digital port signals $N_0$, $N_1$, $N_2$, $N_3$, $N_4$, $N_5$, $N_6$, and $N_7$ is a weighted summation relationship with the offset $V_s/2$. In the weighted summation relationship, the lowest weight bit is $N_0$, the highest weight bit is $N_7$, and the minimum change step length is $V_s/2^7$.

According to Kirchhoff's law, the potential $V_M$ at the inverting end of the comparator is:

$$V_M = V_{224} + V_{AB} + V_B \quad (12).$$

In the above equation, $V_{224}$ represents a voltage across the voltage source, and $V_M$ represents an internal reference voltage of the actual comparator. The port B receives a reference voltage generated by the voltage dividing resistor string 124 in FIG. 3, and $V_{224}$ simulates an offset voltage of the actual comparator. For the corrected comparator, $V_{224}$ and $V_B$ are unchanged. According to equation (11), $V_{AB}$ is adjustable digitally, so is $V_M$.

During correction, the port A receives the voltage signal from the analog-to-digital converter 128 in FIG. 3. The comparator self-correcting process shown in FIG. 9 is as follows.

Figure 10:
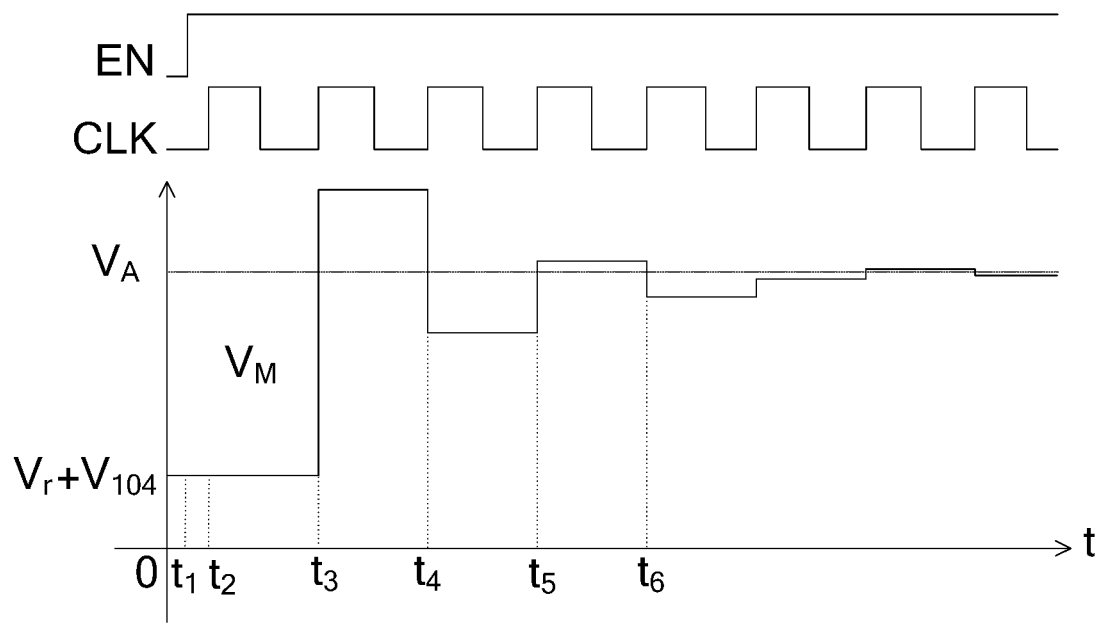
FIG. 10 is a self-correcting timing diagram of the comparator in FIG. 9.

As shown in FIG. 10, the enabling signal EN is at a low level, and the successive approximation register 221 is reset. Reset values of the digital signals $N_7$, $N_6$, $N_5$, $N_4$, $N_3$, $N_2$, $N_1$, and $N_0$ are 10000000. According to equation (11), $V_{AB}$ is 0; and according to equation (12), the internal reference voltage $V_M$ of the comparator is $(V_B+V_{224})$, as shown at time 0 in FIG. 10.

At time $t_1$, the level of the enabling signal EN jumps from a low level to a high level to start a correction process. Subsequently, the rising edge of the first clock signal CLK arrives (as shown at time $t_2$ in FIG. 10), and the successive approximation register 221 keeps the reset values 10000000 of the digital signals $N_7$, $N_6$, $N_5$, $N_4$, $N_3$, $N_2$, $N_1$, and $N_0$ unchanged, and the internal reference voltage $V_M$ is kept as $(V_B+V_{224})$. The comparator 223 compares voltage signals at its non-inverting port and inverting port, and feeds a comparison result back to the data input end $D_{in}$ of the successive approximation register 221.

If $V_M$ is lower than $V_A$, when the rising edge of the second clock signal CLK arrives, the successive approximation register 221 keeps $N_7$ at 1, and sets $N_6$ to 1. According to equations (11) and (12), $V_M$ increases by $V_s/4$ as shown at time $t_3$ in FIG. 10.

If $V_M$ is higher than $V_A$, when the rising edge of the second clock signal CLK arrives, the successive approximation register 221 sets $N_7$ to 0, and sets $N_6$ to 1. According to equations (11) and (12), $V_M$ decreases by $V_s/4$.

Thereafter, the comparator 123 compares $V_M$ with $V_A$ again, and feeds back a comparison result to the data input end $D_{in}$ of the successive approximation register 221.

If $V_M$ is lower than $V_A$, when the rising edge of the third clock signal CLK arrives, the successive approximation register 221 keeps $N_6$ at 1, and sets $N_5$ to 1. According to equations (11) and (12), $V_M$ increases by $V_s/8$.

If $V_M$ is higher than $V_A$, when the rising edge of the third clock signal CLK arrives, the successive approximation register 221 sets $N_6$ to 0, and sets $N_5$ to 1. According to equations (11) and (12), $V_M$ decreases by $V_s/8$ shown at time $t_4$ in FIG. 10.

Thereafter, the comparator 123 compares $V_M$ with $V_A$ again, and feeds back a comparison result to the data input end $D_{in}$ of the successive approximation register 221.

If $V_M$ is lower than $V_A$, when the rising edge of the fourth clock signal CLK arrives, the successive approximation register 221 keeps $N_5$ at 1, and sets $N_4$ to 1. According to equations (11) and (12), $V_M$ increases by $V_s/16$ as shown at time $t_5$ in FIG. 10.

If $V_M$ is higher than $V_A$, when the rising edge of the fourth clock signal CLK arrives, the successive approximation register 221 sets $N_5$ to 0, and sets $N_4$ to 1. According to equations (11) and (12), $V_M$ decreases by $V_s/16$.

In a process the same as the above process, when the rising edge of the fifth clock signal CLK arrives, the successive approximation register 221 determines $N_4$. When the rising edge of the sixth clock signal CLK arrives, the successive approximation register 221 determines $N_3$. When the rising edge of the seventh clock signal CLK arrives, the successive approximation register 221 determines $N_2$. When the rising edge of the eighth clock signal CLK arrives, the successive approximation register 221 determines $N_1$. When the rising edge of the ninth clock signal CLK arrives, the successive approximation register 221 determines $N_0$. So far, the correction process is completed. The values of the digital signals $N_7$, $N_6$, $N_5$, $N_4$, $N_3$, $N_2$, $N_1$, and $N_0$ are kept by the successive approximation register 221 and used in a normal operation process of the comparator.

Throughout the correction process, according to the comparison results of the comparator 223, the comparator internal reference voltage $V_M$ is sequentially increased or decreased around the $V_A$ by $V_s/2^2$, $V_s/2^3$, $V_s/2^4$, $V_s/2^5$, $V_s/2^6$, $V_s/2^7$, $V_s/2^8$, and $V_s/2^8$, and gradually converges to $V_A$. Finally, the difference between $V_M$ and $V_A$ is only $V_s/2^8$. Using a higher correction bit, such as 10 bit, 12 bit, or 14 bit, $V_M$ can be corrected to be closer to $V_A$. $V_A$ receives a voltage signal output from the DAC 128 in FIG. 3. That is, the comparator internal reference voltage $V_M$ is substantially coincided with the output voltage of the DAC 128 at the end of the correction.

Figure 11:
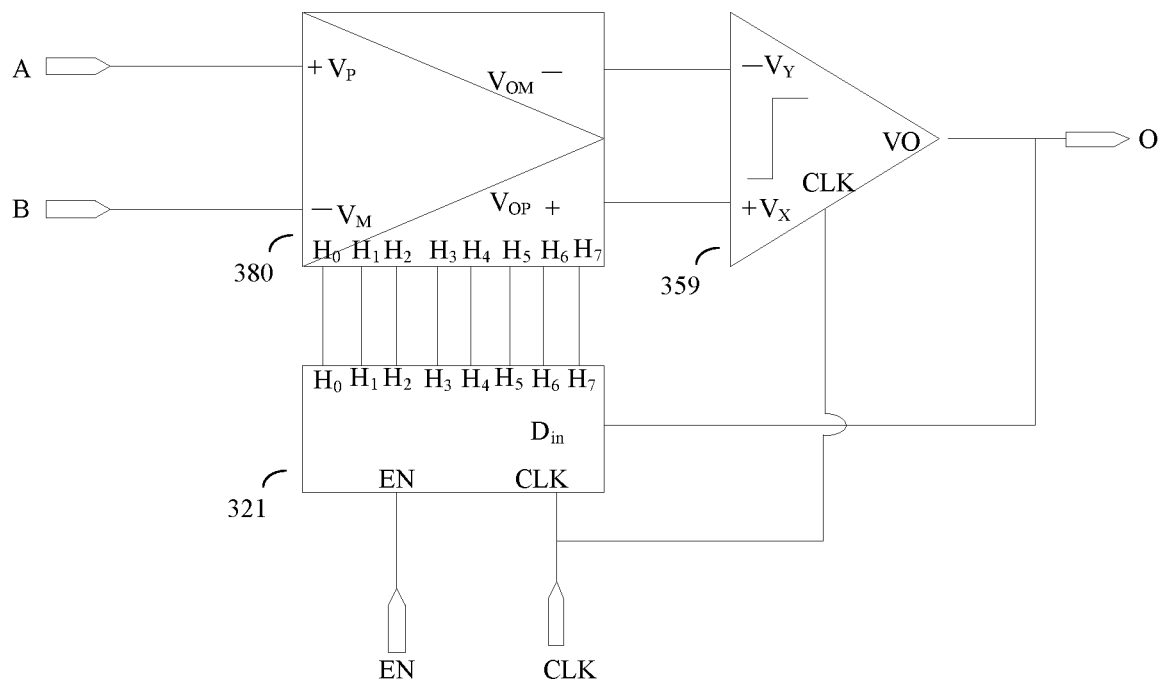
FIG. 11 is a self-correcting circuit diagram of a comparator.

Referring to FIG. 11, in this embodiment, the comparator self-correcting circuit includes an offset digital adjustment amplifier 380, a dynamic comparator 359, a successive approximation register 321, a port A, a port B, a clock port CLK, an enabling port EN and an output port O.

An inverting input end $V_M$ of the offset digital adjustment amplifier 380 is connected to the port B. A non-inverting input end $V_P$ of the offset digital adjustment amplifier 380 is connected to the port A. A non-inverting output end $V_{OP}$ of the offset digital adjustment amplifier 380 is connected to a non-inverting input end $V_X$ of the dynamic comparator 359. An inverting output end $V_{OM}$ of the offset digital adjustment amplifier 380 is connected to an inverting input end $V_Y$ of the dynamic comparator 359. An output end of the dynamic comparator 359 is connected to the output port O. Digital output ends $H_0$, $H_1$, $H_2$, $H_3$, $H_4$, $H_5$, $H_6$, and $H_7$ of the successive approximation register 321 are correspondingly connected to digital input ends $H_0$, $H_1$, $H_2$, $H_3$, $H_4$, $H_5$, $H_6$, and $H_7$ of the offset digital adjustment amplifier 380, respectively. The enabling end EN of the successive approximation register 321 is connected to the enabling port EN; and the data end an of the successive approximation register 321 is connected to the output end of the dynamic comparator 359. The clock port CLK is connected to the clock end CLK of the successive approximation register 321 and the clock end CLK of the dynamic comparator 359.

In the circuit shown in FIG. 11, both the offset digital adjustment amplifier 380 and the dynamic comparator 359 have offset, but the difference therebetween lies in that offset digital of the offset digital adjustment amplifier 380 is adjustable. The offset of the offset digital adjustment amplifier 380 and the offset of the dynamic comparator 359 form an offset of the entire circuit.

Figure 12:
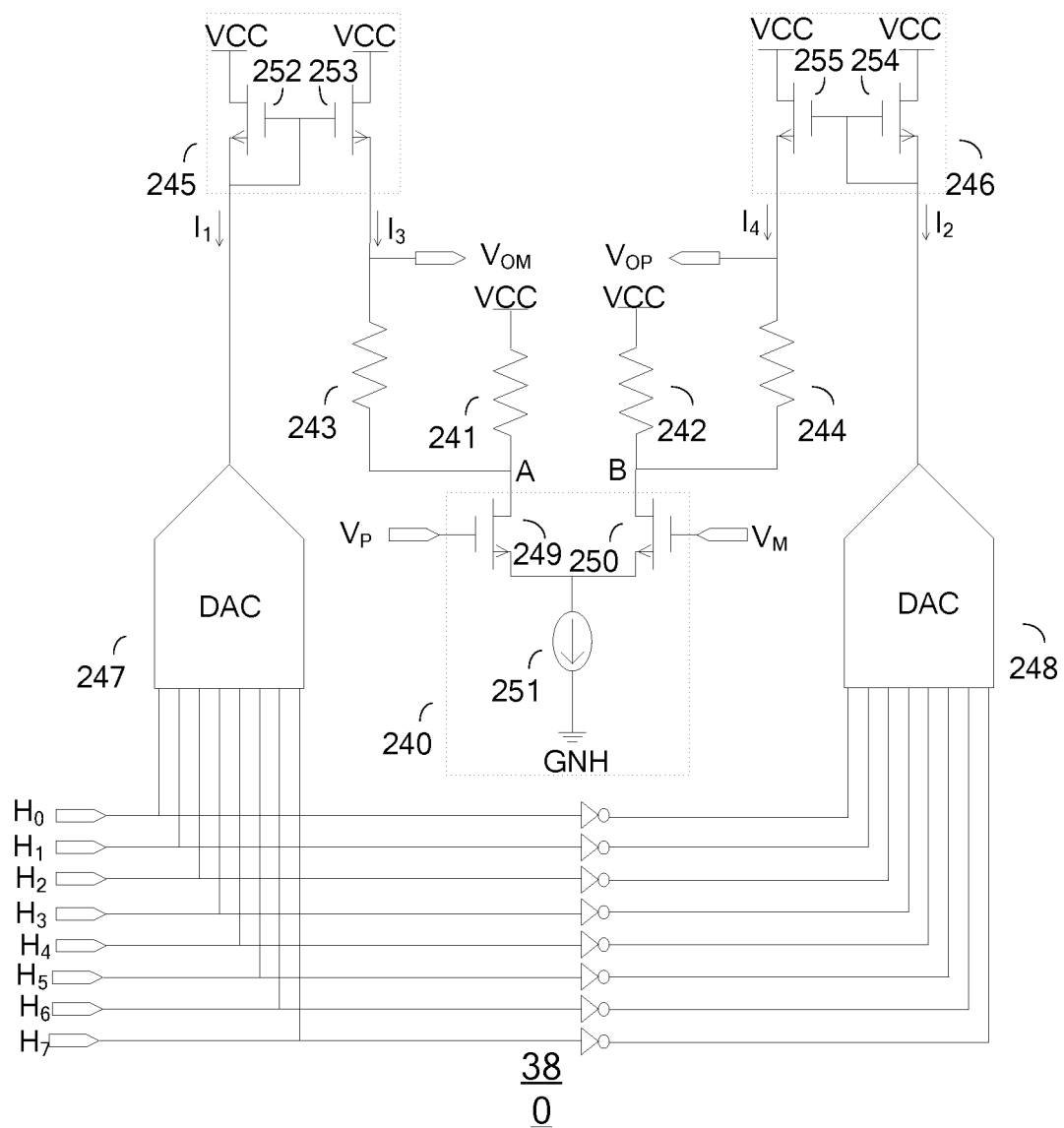
FIG. 12 is a circuit diagram of an offset digital adjustment amplifier in FIG. 11.

As shown in FIG. 12, the offset digital adjustment amplifier 380 includes a differential pair circuit 240, two symmetric load resistors 241 and 242, two symmetric offset adjustment resistors 243 and 244, two symmetric current mirrors 245 and 246, and two symmetric current-type digital-to-analog converters 247 and 248.

In addition, the offset digital adjustment amplifier 380 further includes non-inverting and inverting input ports $V_P$ and $V_M$, non-inverting and inverting output ports $V_{OP}$ and $V_{OM}$, and digital input ends $H_0$, $H_1$, $H_2$, $H_3$, $H_4$, $H_5$, $H_6$, and $H_7$.

The differential pair circuit 240 includes two symmetric NMOS transistors 249 and 250 and a current source 251. After connected together, sources of the NMOS transistors 249 and 250 are connected to a current input end of the current source 251; and a current output end of the current source 251 is grounded. A gate of the NMOS transistor 249 is connected to a non-inverting input port $V_P$, and a gate of the NMOS transistor 250 is connected to an inverting input port $V_M$. A drain of the NMOS transistor 249 is connected to a negative end of the load resistor 241. A positive end of the load resistor 241 is connected to a power source VCC. A drain of the NMOS transistor 250 is connected to a negative end of the load resistor 242. A positive end of the load resistor 242 is connected to the power source VCC. A positive end of the offset adjustment resistor 243 is connected to a drain of the NMOS transistor 249, and a negative end of the offset adjustment resistor 243 is connected to an output end of the current mirror 245 and the inverting output port Wm. A positive end of the offset adjustment resistor 244 is connected to a drain of the NMOS transistor 250, and a negative end of the offset adjustment resistor 244 is connected to an output end of the current mirror 246 and the non-inverting output port $V_{OP}$.

The current mirror 245 includes PMOS transistors 252 and 253; and the current mirror 246 includes PMOS transistors 254 and 255. After being connected together, a gate and a drain of the PMOS transistor 252 serve as an input end of the current mirror 245; and a source of the PMOS transistor 252 is connected to the power source VCC. A gate of the PMOS transistor 253 is connected to a gate of the PMOS transistor 252. Sources of the PMOS transistors 253 and 252 are connected to the power source VCC. A drain of the PMOS transistor 253 serves as an output end of the current mirror 245. After being connected together, a gate and a drain of the PMOS transistor 254 serve as an input end of the current mirror 246; and a source of the PMOS transistor 254 is connected to the power source VCC. A gate of the PMOS transistor 255 is connected to a gate of the PMOS transistor 254. Sources of the PMOS transistors 255 and 254 are connected to the power source VCC. A drain of the PMOS transistor 254 serves as an output end of the current mirror 246. The current mirror 245 mirrors its input current $I_1$ to its output end in a 1:1 ratio to obtain an output current $I_3$. The current mirror 246 mirrors its input current $I_2$ to its output end in a 1:1 ratio to obtain an output current $I_4$.

An output end of the current-type digital-to-analog converter 247 is connected to the input end of the current mirror 245 and outputs current $I_1$. A current output end of the current-type digital-to-analog converter 248 is connected to the input end of the current mirror 246, and outputs current $I_2$. The current-type digital-to-analog converter 247 receives digital signals from the input ports $H_0$, $H_1$, $H_2$, $H_3$, $H_4$, $H_5$, $H_6$, and $H_7$. An input and output relationship of the current-type digital-to-analog converter 247 is as follows:

$$I_1 = c \sum_{i=0}^{7} H_i 2^i. \tag{13}$$

In the above equation, c is a constant number.

The current-type digital-to-analog converter 248 receives complementary codes of digital signal $H_7 H_6 H_5 H_4 H_3 H_2 H_1 H_0$, and the current-type digital-to-analog converter 248 and the digital-to-analog converter 247 are the DACs of the same structure. According to equation (13), the following equation can be obtained:

$$I_2 = c \sum_{i=0}^{7} \overline{H_i} 2^i. \tag{14}$$

Subtracting equation (14) from equation (13), and taking an effect of the current mirror into consideration, the following equation can be obtained:

$$I_3 - I_4 = c \sum_{i=0}^{7} H_i 2^i - c \sum_{i=0}^{7} \overline{H_i} 2^i. \tag{15}$$

The output ports $V_{OP}$ and $V_{OM}$ are connected to a high-impedance circuit, so that the current $I_3$ completely flows through the offset adjustment resistor 243, and the current $I_4$ completely flows through the offset adjustment resistor 244. In the case of $V_P = V_N$, the following equation can be obtained:

$$V_{OM} - V_{OP} = (R_{243} + R_{241})(I_3 - I_4) \tag{16}$$

Substituting equation (15) into equation (16), the following equation can be obtained after arranging:

$$V_{OP} - V_{OM} = c(R_{243} + R_{241})\sum_{i=0}^{7} 2^i - 2c(R_{243} + R_{241})\sum_{i=0}^{7} H_i 2^i. \quad (17)$$

Equation (17) represents an output offset voltage of the offset digital adjustment amplifier 380. Thus, an input offset voltage of the offset digital adjustment amplifier 380 is:

$$V_{io} = \frac{c}{g_m R_{241}}(R_{243} + R_{241})\sum_{i=0}^{7} 2^i - \frac{2c}{g_m R_{241}}(R_{243} + R_{241})\sum_{i=0}^{7} H_i 2^i. \quad (18)$$

In the above equation, $g_m$ represents transconductance of the transistor 249 or 250. The following equation can be obtained by arranging Equation (18):

$$V_{io} = \quad (19)$$
$$-\frac{2c}{g_m R_{241}}(R_{243} + R_{241})2^7 \sum_{i=0}^{7} \frac{H_i}{2^{7-i}} + \frac{c}{g_m R_{241}}(R_{243} + R_{241})(2^8 - 1).$$

In equation (19), the second term on the right side is a constant term, and is independent of the digital signal $H_i$ (i=1-7); and the first term on the right side is a weighted summation term of the digital signal $H_i$ (i=1-7), and has the maximum weight bit of $H_7$ and the minimum weight bit of $H_0$. Here, equations (11) and (19) have the same form. That is, the offset digital adjustment amplifier 380 in FIG. 11 plays the same role as the offset digital adjustment circuit 222 in FIG. 9. In practice, it is also necessary to consider offset caused by random distribution of process parameters. Therefore, the internal reference voltage of the circuit shown in FIG. 11 is:

$$V_M = V_{process} + V_{io} + V_B \quad (20).$$

In the above equation, $V_{process}$ represents the sum of the offset of the offset digital adjustment amplifier 380 and the offset of the dynamic comparator 359 caused by the random distribution of the process parameters, and $V_B$ is the reference voltage generated by the voltage dividing resistor string 124 in FIG. 3. During correction, the port A receives the voltage signal from the analog-to-digital converter 128 in FIG. 3. Through the same correction process, the internal reference voltage of the circuit shown in FIG. 11 can be corrected to be coincided with the output voltage of the DAC 128 in FIG. 3.

All of the dynamic comparator 359 in FIG. 11, the successive approximation register in FIG. 3, the current-type digital-to-analog converter and the voltage-type digital-to-analog converter in FIGS. 3 and 12, and the encoding circuit in FIG. 3 are common techniques in the art, and those skilled in the art can select an appropriate unit circuit structure to implement the method and circuit of the present invention without creative labor according to the spirit of the present invention.

The above are only embodiments of the present invention and not intended to limit the patent scope of the present invention, any equivalent structure made according to the description and accompanying drawings of the present invention, no matter whether it is directly or indirectly used in any other related technical field, should be included within the protection scope of the present invention.

What is claimed is:

1. A successive approximation algorithm-based ADC self-correcting circuit, comprising: an encoding circuit, a voltage dividing resistor string, a comparator array, a multiplexer switch, a first digital-to-analog converter, a reference circuit, a control register, and a data register, wherein the comparator array comprises a plurality of comparators; the voltage dividing resistor string comprises a plurality of resistors connected in series; an input end of the encoding circuit is connected to an output end of the comparator array; a non-inverting input end of each of the comparators in the comparator array is connected to a mobile end of the multiplexer switch; an inverting input end of each of the comparators in the comparator array is correspondingly connected to a point between each two neighboring resistors in the voltage dividing resistor string; an enabling end of the comparator array is connected to the control register; a first immobile end of the multiplexer switch is configured to receive an analog signal, a second immobile end of the multiplexer switch is connected to an output end of the first digital-to-analog converter, and a control end of the multiplexer switch is connected to the control register; the control register is configured to control output of the multiplexer switch; an input end of the first digital-to-analog converter is correspondingly connected to the data register; and the reference circuit is connected to the voltage dividing resistor string and the comparator array, so that an intermediate level and a voltage range of the voltage dividing resistor string are corrected to be consistent with output of the first digital-to-analog converter.

2. The successive approximation algorithm-based ADC self-correcting circuit of claim 1, wherein the voltage dividing resistor string comprises eight resistors which have equal resistance values and which are connected in series; a negative end of the first resistor is connected to a first wire net; a positive end of the first resistor is connected to a negative end of the second resistor; a positive end of the second resistor is connected to a negative end of the third resistor; a positive end of the third resistor is connected to a negative end of the fourth resistor; a positive end of the fourth resistor is connected to a second wire net; a negative end of the fifth resistor is connected to the second wire net; a positive end of the fifth resistor is connected to a negative end of the sixth resistor; a positive end of the sixth resistor is connected to a negative end of the seventh resistor; a positive end of the seventh resistor is connected to a negative end of the eighth resistor; and a positive end of the eighth resistor is connected to a third wire net.

3. The successive approximation algorithm-based ADC self-correcting circuit of claim 2, wherein the comparator array comprises seven comparators operating in parallel; inverting input ports of the seven comparators are connected to positive ends of the first to seventh resistors, respectively; non-inverting input ends of the seven comparators are connected together to receive a signal selected by the multiplexer switch; each of the seven comparators further comprises an enabling end and a clock end; the enabling ends of the first and fourth comparators are grounded; the enabling ends of the second and third comparators are connected to a fourth bit and a fifth bit of the control register, respectively; the enabling ends of the fifth to seventh comparators are connected to a sixth bit, a seventh bit and an eighth bit of the control register, respectively; the clock ends of the seven comparators are connected to a clock signal; output ends of the seven comparators are connected to the encoding circuit so as to generate a binary code after encoded by the encoding circuit; an output end of the first comparator is further connected to a fourth wire net; and an output end of the fourth comparator is further connected to a fifth wire net.

4. The successive approximation algorithm-based ADC self-correcting circuit of claim 1, wherein the reference circuit comprises a second digital-to-analog converter, a successive approximation register, a third digital-to-analog converter, another successive approximation register, a first PMOS switch transistor, a second PMOS switch transistor, a third PMOS switch transistor, a first NMOS switch transistor, a second NMOS switch transistor, a third NMOS switch transistor, a fourth NMOS switch transistor, a fifth NMOS switch transistor, a sixth NMOS switch transistor, a seventh NMOS switch transistor, and an eighth NMOS switch transistor; sources of the first NMOS switch transistor and the second NMOS switch transistor are connected together; a gate of the first NMOS switch transistor is connected to an output end of the second digital-to-analog converter; a gate of the second NMOS switch transistor is connected to the second wire net; after being connected together, a drain and a gate of the first PMOS switch transistor are connected to a drain of the first NMOS switch transistor; after being connected together, a drain and a gate of the second PMOS switch transistor are connected to a drain of the second NMOS switch transistor; a source of the fifth NMOS switch transistor is grounded, and a drain of the fifth NMOS switch transistor is connected to a source of the sixth NMOS switch transistor; a drain of the sixth NMOS switch transistor is connected to the sources of the first and second NMOS switch transistors; a gate of the third PMOS switch transistor is connected to the drain of the first NMOS switch transistor; a drain of the third PMOS switch transistor is connected to the third wire net, and the third wire net is connected to the voltage dividing resistor string; a source of the third NMOS switch transistor is grounded, and a drain of the third NMOS switch transistor is connected to a source of the fourth NMOS switch transistor; a drain of the fourth NMOS switch transistor is connected to the first wire net, and the first wire net is connected to the voltage dividing resistor string; the second wire net is led from the middle of the voltage dividing resistor string to be fed back to the gate of the second NMOS switch transistor; a drain of the first NMOS switch transistor is connected to the gate of the third PMOS switch transistor; and the second wire net is connected to the gate of the second NMOS switch transistor.

5. The successive approximation algorithm-based ADC self-correcting circuit of claim 4, wherein eight digital input ends of the second digital-to-analog converter are connected to eight digital output ends of the successive approximation register, respectively; a clock input end of the successive approximation register receives the clock signal, an enabling end of the successive approximation register is connected to a second bit of the control register, and a data input end of the successive approximation register is connected to the fifth wire net; and the fifth wire net is further connected to the comparator array.

6. The successive approximation algorithm-based ADC self-correcting circuit of claim 5, wherein a source of the seventh NMOS switch transistor is grounded; after being connected together, a gate and a drain of the seventh NMOS switch transistor are connected to gates of the fifth and third NMOS switch transistors and a source of the eighth NMOS switch transistor; after being connected together, a gate and a drain of the eighth NMOS switch transistor are connected to gates of the sixth and fourth NMOS switch transistors and an output end of the third digital-to-analog converter.

7. The successive approximation algorithm-based ADC self-correcting circuit of claim 6, wherein eight digital input ends of the third digital-to-analog converter are correspondingly connected to the eight digital output ends of the successive approximation register; the clock input end of the successive approximation register receives the clock signal, the enabling end of the successive approximation register is connected to a third bit of the control register, and the data input end of the successive approximation register is connected to the fourth wire net; and the fourth wire net is connected to the comparator array.

8. The successive approximation algorithm-based ADC self-correcting circuit of claim 1, wherein resistance values of the plurality of resistors in the voltage dividing resistor string are equal.

9. The successive approximation algorithm-based ADC self-correcting circuit of claim 3, wherein an intermediate output level $V_{100}$ of the first digital-to-analog converter is configured to correct an internal reference level $V_{refl43}$ of the fourth comparator in the comparator array; a minimum output level $V_{001}$ of the first digital-to-analog converter is configured to correct an internal reference level $V_{refl40}$ of the first comparator; a second minimum output level $V_{010}$ of the first digital-to-analog converter is configured to correct an internal reference level $V_{refl41}$ of the second comparator in the comparator array; a third minimum output level $V_{011}$ of the first digital-to-analog converter is configured to correct an internal reference level $V_{refl42}$ of the third comparator in the comparator array; a fifth minimum output level $V_{101}$ of the first digital-to-analog converter is configured to correct an internal reference level $V_{refl44}$ of the fifth comparator in the comparator array; a sixth minimum output level $V_{110}$ of the first digital-to-analog converter is configured to correct an internal reference level $V_{refl45}$ of the sixth comparator in the comparator array; a seventh minimum output level $V_{111}$ of the first digital-to-analog converter is configured to correct an internal reference level $V_{refl46}$ of the seventh comparator in the comparator array, so that the internal reference levels $V_{refl40}$, $V_{refl41}$, $V_{refl42}$, $V_{refl43}$, $V_{refl44}$, $V_{refl45}$ and $V_{refl46}$ are consistent with output of the first digital-to-analog converter; and corrected internal reference voltages $V_{refl40}$, $V_{refl41}$, $V_{refl42}$, $V_{refl43}$, $V_{refl44}$, $V_{refl45}$ and $V_{refl46}$ are distributed uniformly.

10. The successive approximation algorithm-based ADC self-correcting circuit of claim 4, wherein the first to third digital-to-analog converters are voltage-type converters.

* * * * *